United States Patent
Ono et al.

(10) Patent No.: US 8,981,732 B2
(45) Date of Patent: Mar. 17, 2015

(54) SWITCH, CHARGE MONITORING APPARATUS AND RECHARGEABLE BATTERY MODULE

(75) Inventors: Kazutoshi Ono, Fukuoka (JP); Naoto Yanase, Fukuoka (JP); Hiroyasu Tagami, Fukuoka (JP); Nobuhiko Shigyo, Fukuoka (JP); Toshio Suzuki, Fukuoka (JP); Kouzi Tsukamoto, Fukuoka (JP)

(73) Assignee: Sony Corporation, Tokyo (JP)

( * ) Notice: Subject to any disclaimer, the term of this patent is extended or adjusted under 35 U.S.C. 154(b) by 387 days.

(21) Appl. No.: 13/592,436

(22) Filed: Aug. 23, 2012

(65) Prior Publication Data

US 2013/0049760 A1    Feb. 28, 2013

(30) Foreign Application Priority Data

Aug. 31, 2011 (JP) ................................. 2011-189891
Jun. 7, 2012 (JP) ................................. 2012-130116

(51) Int. Cl.
| | | |
|---|---|---|
| H02J 7/06 | (2006.01) | |
| G01N 27/416 | (2006.01) | |
| H03K 17/687 | (2006.01) | |
| H01M 10/48 | (2006.01) | |
| H03K 17/10 | (2006.01) | |
| H02J 7/00 | (2006.01) | |

(52) U.S. Cl.
CPC ........... *H01M 10/482* (2013.01); *H03K 17/102* (2013.01); *H02J 7/0021* (2013.01); *H03K 2217/0009* (2013.01); *H03K 2217/0018* (2013.01)

USPC .............................. 320/159; 324/427; 327/436

(58) Field of Classification Search
USPC .............................. 324/427; 327/436; 320/159
See application file for complete search history.

(56) References Cited

U.S. PATENT DOCUMENTS

| | | | | |
|---|---|---|---|---|
| 5,457,414 A | * | 10/1995 | Inglis et al. ..................... | 327/77 |
| 5,909,386 A | * | 6/1999 | Shiraishi ....................... | 708/710 |
| 7,091,709 B2 | * | 8/2006 | Suzuki ........................... | 323/274 |
| 2004/0223383 A1 | * | 11/2004 | Kunemund ..................... | 365/200 |
| 2007/0035989 A1 | * | 2/2007 | Fouli ............................. | 365/154 |
| 2010/0188047 A1 | * | 7/2010 | Liu et al. ....................... | 320/118 |
| 2012/0169794 A1 | * | 7/2012 | Uchino et al. ................. | 345/690 |

FOREIGN PATENT DOCUMENTS

| | | |
|---|---|---|
| JP | 11-215731 | 8/1999 |
| JP | 2006-507790 | 3/2006 |

* cited by examiner

*Primary Examiner* — M'baye Diao
(74) *Attorney, Agent, or Firm* — Rader, Fishman & Grauer PLLC

(57) ABSTRACT

Disclosed herein is a switch for turning on/off the connection between a first terminal and a second terminal. The switch includes a first transistor circuit configured from two transistors connected in series between the first terminal and the second terminal; and a second transistor circuit having a gate terminal connected to source terminals of the two transistors and a source terminal connected to gate terminals of the two transistors. The connection between the first terminal and the second terminal is changed over between on and off states by changing over a potential to the source terminal of the second transistor circuit between high and low levels.

18 Claims, 25 Drawing Sheets

SWITCH, CHARGE MONITORING APPARATUS AND RECHARGEABLE BATTERY MODULE

BACKGROUND

This disclosure relates to a switch, a charge monitoring apparatus and a rechargeable battery module.

As represented by a lithium-ion battery pack, a charging apparatus which can repetitively carry out charging and discharging is known. Generally, the charging apparatus includes a rechargeable battery cell unit formed from a plurality of rechargeable battery cells connected in series. If charging and discharging of the rechargeable battery cell unit are carried out, then the rechargeable battery cells which configure the rechargeable battery cell unit are charged and discharged and the charged state of each rechargeable battery cell varies. At this time, the charged state of the rechargeable battery cells sometimes exhibits a dispersion among the cells. To repeat charging and discharging of the rechargeable battery cells while the charged state of them exhibits a dispersion leads to reduction of the life span of the rechargeable battery cells and hence of the life span of the entire rechargeable battery cell unit and therefore is not desirable. Therefore, a method has been proposed to monitor the charged state of each of rechargeable battery cells which configure a rechargeable battery cell unit and control charging and discharging of each rechargeable battery cell in response to the charged state of the rechargeable battery cell. The method is disclosed, for example, in Japanese Patent No. 3829453.

In order to achieve reduction in size and cost of a monitoring circuit for monitoring the charged state of a rechargeable battery cell, it is desired to form the monitoring circuit as an LSI (Large Scale Integration). In order to form the monitoring circuit as an LSI, it is desired to configure a switch for changing over a rechargeable battery cell to be monitored by a transistor or the like. JP-T-2006-507790 discloses a configuration wherein a switch for changing over a rechargeable battery cell to be monitored is configured from a transistor.

SUMMARY

However, in an ordinary monitoring circuit, a high breakdown voltage switch is used as a switch for preventing reverse flow of current from a rechargeable battery cell to the monitoring circuit and selecting a rechargeable battery cell to be monitored by the monitoring circuit. A high breakdown voltage transistor which configures the high breakdown voltage switch is great in device size and low in driving capacity, and therefore, it is difficult to suppress the ON resistance of the switch low. Further, in a switch configuration widely known as a popular bidirectional switch wherein a PMOS transistor and an NMOS transistor are placed opposite to each other, a high breakdown voltage is used for both of the gate-source voltage Vgs and the drain-source voltage Vds. Therefore, both of the PMOS transistor and the NMOS transistor are configured from a high breakdown voltage transistor.

Consequently, the circuit area of the switch increases, resulting in difficulty in miniaturization of the LSI. Further, the fabrication procedure of a wafer is complicated, resulting in difficulty in reduction in cost.

The present disclosure provides a switch which can be implemented with a reduced circuit area using a low breakdown voltage transistor.

The present disclosure further provides a charge monitoring apparatus and a rechargeable battery module which include such a switch as just described.

According to an embodiment of the present disclosure, there is provided a switch for turning on/off the connection between a first terminal and a second terminal, the switch including: a first transistor circuit configured from two transistors connected in series between the first terminal and the second terminal; and a second transistor circuit having a gate terminal connected to source terminals of the two transistors and a source terminal connected to gate terminals of the two transistors, the connection between the first terminal and the second terminal being changed over between on and off states by changing over a potential to the source terminal of the second transistor circuit between high and low levels.

In the switch configured in such a manner as described above, the gate potential of any of the first transistor circuit and the second transistor circuit varies following up the source potential of the other one of the first and second transistors. Therefore, the gate-source voltage Vgs of the transistors which configure the switch can be reduced. Consequently, the switch can be configured using low breakdown voltage transistors and can be formed in a reduced size.

According to another embodiment of the present disclosure, there is provided a switch for turning on/off the connection between a first terminal and a second terminal, the switch including: a PMOS switch formed from two PMOS transistors connected in series between the first terminal and the second terminal; a first switch controlling circuit including a transistor having a gate terminal connected to source terminals of the two PMOS transistors and a source terminal connected to gate terminals of the two PMOS transistors; an NMOS switch formed from two NMOS transistors connected in series between the first terminal and the second terminal; and a second switch controlling circuit including a transistor having a gate terminal connected to source terminals of the two NMOS transistors and a source terminal connected to gate terminals of the two NMOS transistors.

According to still another embodiment of the present disclosure, there is provided a switch for turning on/off the connection between a first terminal and a second terminal, the switch including: a plurality of switch circuits each having a first transistor circuit configured from two transistors connected in series between the first terminal and the second terminal, a second transistor circuit having a gate terminal connected to source terminals of the two transistors and a source terminal connected to gate terminals of the two transistors, a first current mirror circuit connected to the source terminal of the second transistor circuit, a first transistor having a drain terminal connected to the first current mirror circuit, a first switch having a first end connected to a gate terminal of the first transistor, and a second switch having a first end connected to the gate terminal of the first transistor and a second end grounded; and a second transistor having a gate terminal connected to a second end of the first switches of the switch circuits, the first switch being changed over between on and off states to change over whether or not the first transistor and the second transistor are to operate as a second current mirror circuit whereas the second switch is changed over between on and off states to change over whether or not current is to be supplied to the first and second current mirror circuits thereby to changeover the potential at the source terminal of the second transistor circuit between high and low levels.

According to a further embodiment of the present disclosure, there is provided a charge monitoring apparatus for monitoring a charged state of a plurality of rechargeable battery cells, the charge monitoring apparatus including: a potential measuring section configured to measure a potential of the rechargeable battery cells; and a switch configured to select one of the rechargeable battery cells which is to be measured by the potential measuring section, the switch turning on/off the connection between the selected one of the rechargeable battery cells and the potential measuring section, the switch including a first transistor circuit configured from two transistors connected in series between the rechargeable battery cells and the potential measuring section, and a second transistor circuit having a gate terminal connected to source terminals of the two transistors and a source terminal connected to gate terminals of the two transistors, the connection between the rechargeable battery cells and the potential measuring section being changed over between on and off states by changing over a potential to the source terminal of the second transistor circuit between high and low levels.

According to a still further embodiment of the present disclosure, there is provided a rechargeable battery module including: a plurality of rechargeable battery cells; and a charge monitoring apparatus including a potential measuring section for measuring a potential of the rechargeable battery cells and a switch for selecting one of the rechargeable battery cells which is to be measured by the potential measuring section, the switch turning on/off the connection between the selected one of the rechargeable battery cells and the potential measuring section, the switch including a first transistor circuit configured from two transistors connected in series between the rechargeable battery cells and the potential measuring section, and a second transistor circuit having a gate terminal connected to source terminals of the two transistors and a source terminal connected to gate terminals of the two transistors, the connection between the rechargeable battery cells and the potential measuring section being changed over between on and off states by changing over a potential to the source terminal of the second transistor circuit between high and low levels.

With the present disclosure, a switch which can achieve reduction in circuit area using low breakdown voltage transistors can be provided. Further, a charge monitoring apparatus and a rechargeable battery module which include such a switch as just described can be provided.

BRIEF DESCRIPTION OF THE DRAWINGS

FIG. 7 is a diagram illustrating a transition of a gate-source voltage when the switch is changed over from off to on;

DETAILED DESCRIPTION OF THE PREFERRED EMBODIMENTS

Figure 1:
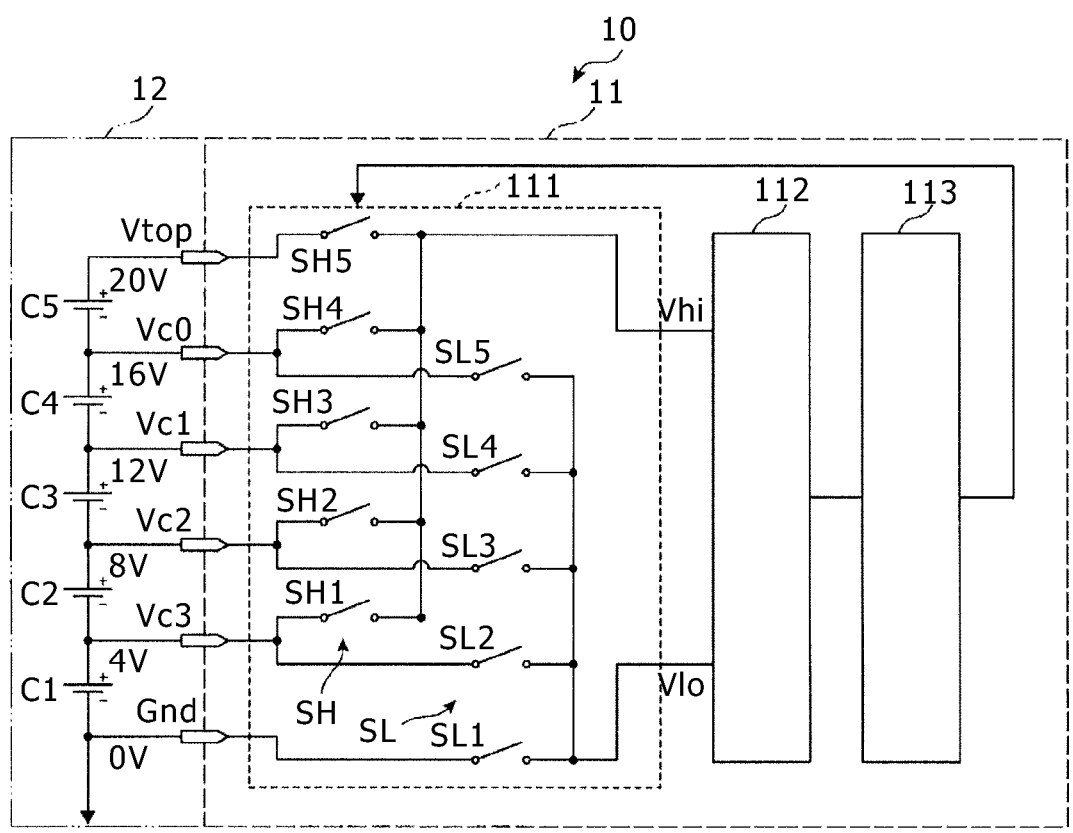
FIG. 1 is a schematic block diagram of a rechargeable battery module according to a first embodiment.

In the following, the present technology is described in accordance with the following order.
A. Rechargeable Battery Module of the First Embodiment
B. Rechargeable Battery Module of the Second Embodiment
C. Summary
A. Rechargeable Battery Module of the First Embodiment As an application example of the present technology, a general configuration of a rechargeable battery module 10 is shown in FIG. 1. Referring to FIG. 1, the rechargeable battery module 10 includes a rechargeable battery cell unit 12 having a plurality of rechargeable battery cells, and a battery monitor unit 11 for selecting a rechargeable battery cell of the rechargeable battery cell unit 12 and measuring a state of the selected rechargeable battery cell.

The rechargeable battery cell unit 12 includes a plurality of rechargeable battery cells C1, C2, . . . . The rechargeable battery cells C1, C2, . . . are secondary battery cells for which charging and discharging can be carried out repetitively, for example, like lithium-ion battery cells. In FIG. 1, the rechargeable battery module 10 is shown configured such that the rechargeable battery cell unit 12 includes five rechargeable battery cells C1 to C5 connected in series and in order from the low voltage side. The rechargeable battery cells C1 to C5 have an upper limit voltage of 4 V. Therefore, in a state in which the rechargeable battery cells C1 to C5 are charged fully, the negative terminal side of the rechargeable battery cell C1 exhibits 0 V and the positive terminal side of the rechargeable battery cell C1 exhibits 4 V. Consequently, the negative terminal side of the rechargeable battery cell C5 exhibits 16 V and the positive terminal side of the rechargeable battery cell C5 exhibits 20 V. It is to be noted that the potentials of the rechargeable battery cells and the connected number of such rechargeable battery cells, which is five in the present embodiment, are an example, and a different voltages range and a different connection number other than those given above may be used.

The battery monitor unit 11 is shown as an example of a charge monitoring apparatus. The battery monitor unit 11 includes a measuring cell selection section 111 for selecting a rechargeable battery cell to be measured, a potential measuring section 112 for measuring the potential of the selected rechargeable battery cell, and a logic circuit 113 for instructing the measuring cell selection section 111 of the measurement cell to be selected.

The measuring cell selection section 111 has positive terminal switches SH, that is, SH1 to SH5, for selecting the potential on the positive terminal side of the respective rechargeable battery cells, and negative terminal switches SL, that is, SL1 to SL5, for selecting the potential on the negative terminal side of the respective rechargeable battery cells. The measuring cell selection section 111 selects a rechargeable battery cell to be measured by electrically connecting a positive terminal switch SH and a negative terminal switch SL of a pertaining pair based on a selection signal outputted from the logic circuit 113.

For example, if a selection signal for selecting the rechargeable battery cell C1 is outputted from the logic circuit 113, then the measuring cell selection section 111 controls the positive terminal switch SH1 and the negative terminal switch SL1 to an on state while it controls the other positive terminal switches SH2 to SH5 and the negative terminal switches SL2 to SL5 to an off state. At this time, the measuring cell selection section 111 outputs the potential on the positive side of the rechargeable battery cell C1 inputted thereto through a terminal Vc3 thereof as a high voltage side potential Vhi and outputs the potential on the negative side of the rechargeable battery cell C1 inputted thereto through a terminal Gnd thereof as a low voltage side potential Vlo. Therefore, the potential measuring section 112 can measure the voltage across the rechargeable battery cell C1 by detecting the potential difference between the high voltage side potential Vhi and the low voltage side potential Vlo both outputted from the measuring cell selection section 111.

Similarly, if a selection signal for selecting the rechargeable battery cell C4 is outputted from the logic circuit 113, then the measuring cell selection section 111 selectively controls the positive terminal switch SH4 and the negative terminal switch SL4 to an on state while it controls the other positive terminal switches SH1 to SH3 and SH5 and the negative terminal switches SL1 to SL3 and SL5 to an off state. At this time, the measuring cell selection section 111 outputs the potential on the positive side of the rechargeable battery cell C4 inputted thereto through a terminal Vc0 thereof as the high voltage side potential Vhi and outputs the potential on the negative side of the rechargeable battery cell C4 inputted thereto through a terminal Vc1 thereof as the low voltage side potential Vlo. Therefore, the potential measuring section 112 can measure the voltage across the rechargeable battery cell C4 by detecting the potential difference between the high voltage side potential Vhi and the low voltage side potential Vlo both outputted from the measuring cell selection section 111.

The potential measuring section 112 includes an analog to digital converter (ADC) for converting a measured analog voltage of a rechargeable battery cell into a digital voltage signal. The logic circuit 113 carries out a signal process for the voltage signal outputted from the potential measuring section 112 and outputs a resulting signal to a charge monitoring controlling section not shown. The charge monitoring controlling section controls a power supply apparatus based on a measured charged state of the individual rechargeable battery cells, for example, to supply power to those rechargeable battery cells which exhibit an insufficient charged state so that the rechargeable battery cells may be charged up without a dispersion thereamong. The potential measuring section 112 and the logic circuit 113 are low breakdown voltage circuits configured, for example, from a MOS transistor and so forth.

Upon the positive terminal switches SH1 to SH5 and the negative terminal switches SL1 to SL5 used in the rechargeable battery module 10, a maximum voltage of the rechargeable battery cell unit 12 can act depending upon the order or the timing of switching. The present disclosure proposes a switch which is configured from a low breakdown voltage device and which implements reduction of the gate-source voltage Vgs and turns on/off between the terminal on the rechargeable battery cell side and the terminal of the potential measuring section side while preventing reverse flow of current under a high voltage. It is to be noted that, since a maximum voltage of the rechargeable battery cell unit 12 can act between the terminal on the rechargeable battery cell side and the terminal on the potential measuring section side, the switch is configured in a high breakdown voltage device configuration in regard to the drain-source voltage Vds. In the following description, in order to distinguish the switch according to the present technology which turns on/off between the terminal on the rechargeable battery cell side and the terminal on the potential measuring section side and a switch (SW) for rendering this switch operative from each other, the switch according to the present technology is referred to as high breakdown voltage switch.

A-1. First Configuration Form of the High Breakdown Voltage Switch

Figure 2:
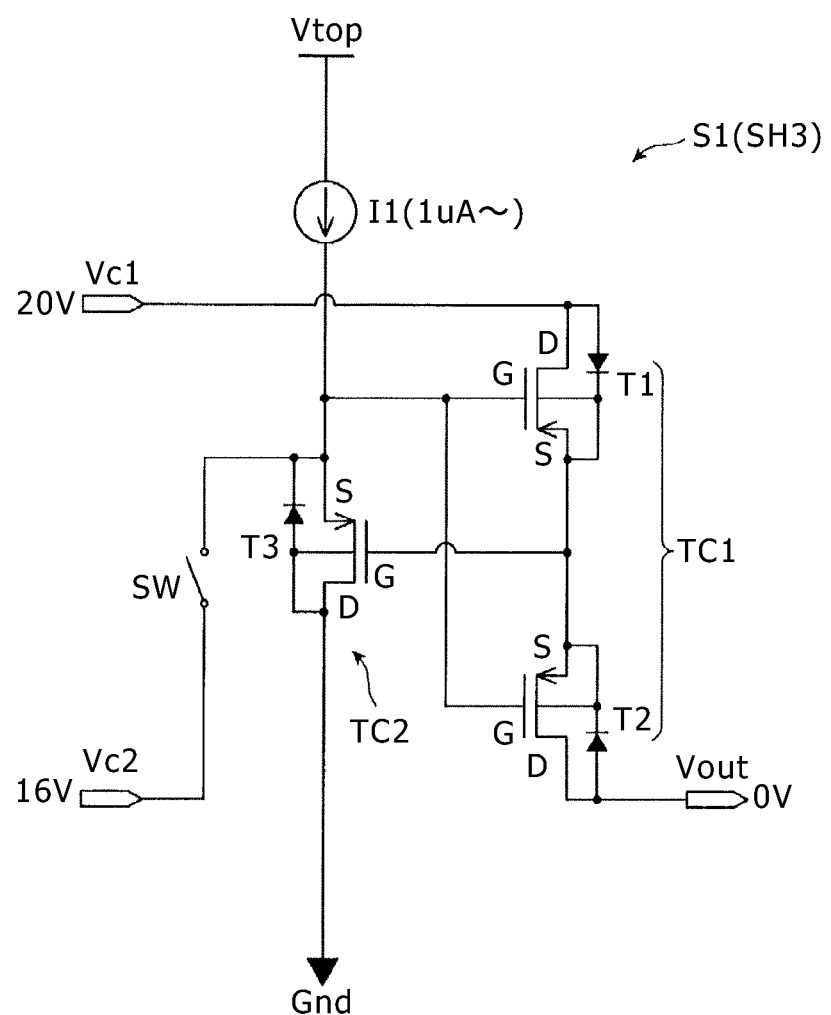
FIG. 2 is a circuit diagram showing a basic configuration of a high breakdown voltage switch of a first configuration form.

A basic configuration of a high breakdown voltage switch S1 of a first configuration form is shown in FIG. 2. FIG. 2 shows a basic configuration of the high breakdown voltage switch in the case where the channel structure uses a PMOS transistor of the P type. It is to be noted that, in FIG. 2, as an example of the high breakdown voltage switch S1 which turns on/off between a terminal on the rechargeable battery cell side and a terminal on the potential measuring section side, the positive terminal switch SH3 is shown which turns on/off between the terminal Vc1 and a terminal Vout which is an output terminal of the high voltage side potential Vhi. It is to be noted that, as the high breakdown voltage switch S1, a negative terminal switch SL4 which turns on/off between the terminal Vc1 and the terminal Vout which is an output terminal of the low voltage side potential Vlo may be formed.

The high breakdown voltage switch S1 is configured from a first transistor circuit TC1 formed from two transistors T1 and T2 connected in series between the terminal Vc1 and the terminal Vout, and a second transistor circuit TC2 including a transistor T3 connected at the gate terminal thereof to the source terminals of the transistors T1 and T2 and at the source terminal thereof to the gate terminals of the transistors T1 and T2.

In the high breakdown voltage switch S1 of the present configuration form, the source terminals of the two PMOS transistors T1 and T2 are connected in series to each other and are connected to the gate terminal of the PMOS transistor T3. The drain terminal of one of the transistors T1 and T2 connected in series, that is, of the transistor T1, is connected to the terminal Vc1 while the drain terminal of the other one of the transistors T1 and T2, that is, of the transistor T2, is connected to the terminal Vout. In other words, the transistors T1 and T2 configure a high breakdown voltage switch which opens and closes between the terminal Vc1 and the terminal Vout. The transistor T3 is connected at the source terminal thereof to a current source I1 and also to the gate terminals of the transistors T1 and T2 and further to the terminal Vc2 through a switch SW. The transistor T3 is connected at the drain terminal thereof to a ground terminal Gnd of the ground potential.

The current source I1 supplies a very low bias current of approximately 1 μA to the source terminal of the transistor T3. The switch SW turns on/off between the source terminal of the transistor T3 and the terminal Vc2 to carry out changeover of whether or not current supplied from the current source I1 is to flow down thereby to change over the potential at the gate terminal of the transistors T1 and T2 between the high and low potentials.

Figure 3:
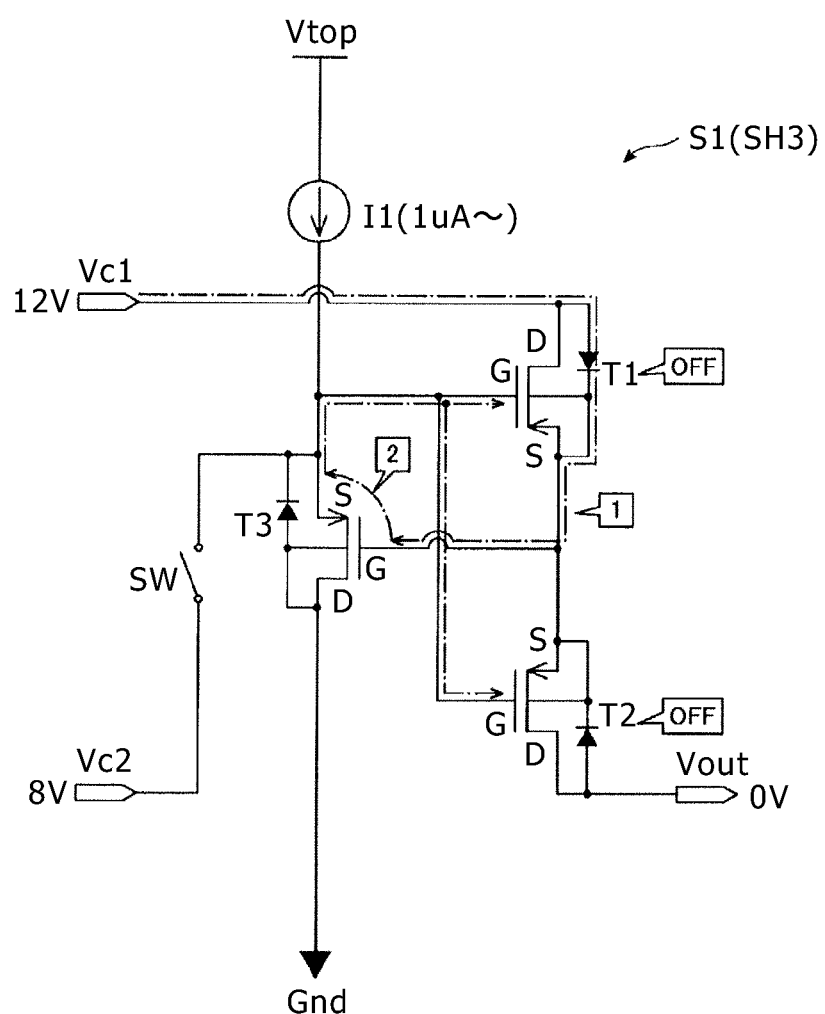
FIG. 3 is a similar view but illustrating an operational situation of a potential at various portions of the high breakdown voltage switch when the switch is off and a forward potential is applied.
Figure 4:
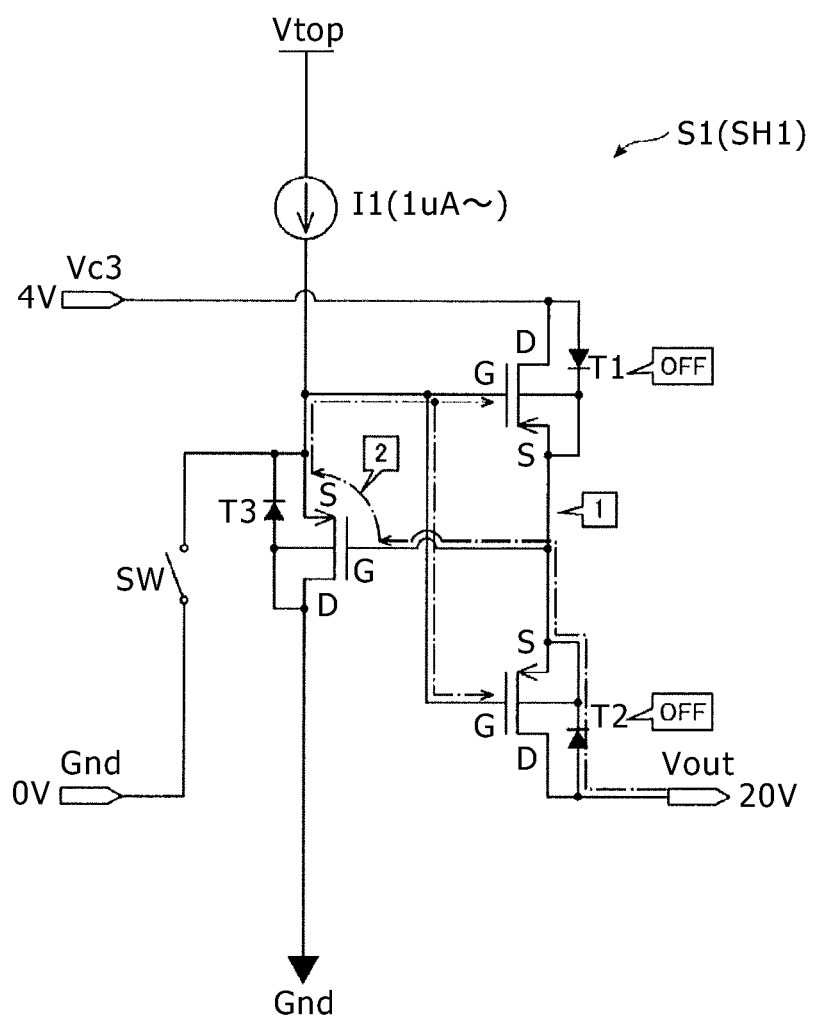
FIG. 4 is a similar view but illustrating an operational situation of a potential at the various portions of the high breakdown voltage switch when the switch is off and a reverse potential is applied.

Operation of the high breakdown voltage switch S1 having such a basic configuration is described. First, turning off and reverse flow preventing operations when the high breakdown voltage switch S1 is in an off state are described with reference to FIGS. 3 and 4. FIG. 3 illustrates the positive terminal switch SH3 as an example in a case wherein the potential on the rechargeable battery cell side is higher than the potential on the potential measuring section side, and this relationship between the potentials is hereinafter referred to as forward direction potential. FIG. 4 illustrates the positive terminal switch SH1 as an example in a case wherein the potential on the rechargeable battery cell side is lower than the potential on the potential measuring section side, and this relationship between the potentials is hereinafter referred to as reverse direction potential.

FIG. 3 illustrates an operational situation of potentials at several portions in the forward direction potential in the case where the switch SW is off. It is to be noted that voltages indicated at the terminals Vc1, Vout and Vc2 are exemplary voltages for indicating that they are in a state in which the potential at the terminal Vc1 on the rechargeable battery cell side is higher than the potential at the terminal Vout of the potential measuring section side, that is, in a potential state in the forward direction.

In the forward direction potential state illustrated in FIG. 3, a potential at the terminal Vc1 acts upon the drain terminal of the transistor T1. At this time, the source potential of the transistors T1 and T2 becomes close to the potential at the terminal Vc1 by an action of the parasitic diode of the transistor T1 (numeral 1). Also the gate potential of the transistor T3 becomes close to the potential at the terminal Vc1 together with the source potential of the transistors T1 and T2. The source potential of the transistor T3 operates with bias current of the current source I1, and if it becomes a saturated state, then a voltage corresponding to the bias current is generated between the gate and the source. This voltage is higher by a voltage Vgs than the potential at the terminal Vc1 (numeral 2). Since the source potential of the transistor T3 is inputted to the gate terminal of the transistors T1 and T2, a voltage higher by the voltage Vgs than the potential at the terminal Vc1 acts upon the gate of the transistors T1 and T2.

Therefore, the transistors T1 and T2 are placed into an off state, and the terminal Vc1 and the terminal Vout are placed into a disconnected state therebetween. At this time, since the parasitic diode of the transistor T2 is biased in the reverse direction with respect to the potential at the terminal Vout, the voltage on the source side is not outputted to the terminal Vout side. Accordingly, the high breakdown voltage switch S1 assumes an off state and current does not leak.

FIG. 4 illustrates an operational situation of potentials at several portions in the reverse direction potential in the case where the switch SW is off. It is to be noted that voltages indicated at the terminals Vc3, Vout and Gnd are exemplary voltages for indicating that they are in a state in which the potential at the terminal Vc3 on the rechargeable battery cell side is lower than the potential at the terminal Vout of the potential measuring section side, that is, in a potential state in the reverse direction. In the present example illustrated, a maximum voltage 20 V of the rechargeable battery cell unit 12 remains at the terminal Vout.

In the reverse direction potential state illustrated in FIG. 4, a potential at the terminal Vout acts upon the drain terminal of the transistor T2. At this time, the source potential of the transistors T1 and T2 becomes close to the potential at the terminal Vout by an action of the parasitic diode of the transistor T2 (numeral 1). Also the gate potential of the transistor T3 becomes close to the potential at the terminal Vout together with the source potential of the transistors T1 and T2. Meanwhile, the source potential of the transistor T3 operates with bias current of the current source I1, and when it becomes a saturated state, a voltage corresponding to the bias current is generated between the gate and the source of the transistor T3. This voltage is higher by the gate-source voltage Vgs than the potential at the terminal Vout (numeral 2). Since the source potential of the transistor T3 is inputted to the gate terminal of the transistors T1 and T2, a voltage higher by the gate-source voltage Vgs than the potential at the terminal Vout acts upon the gate of the transistors T1 and T2.

Therefore, the transistors T1 and T2 are placed into an on state, and the connection between the terminal Vc3 and the terminal Vout is placed into an off state. At this time, since the parasitic diode of the transistor T1 is biased in the reverse direction with respect to the potential at the terminal Vc3, the voltage on the source side is not outputted to the terminal Vc3 side. Accordingly, the high breakdown voltage switch S1 assumes an off state and current does not flow reversely.

Accordingly, when the high breakdown voltage switch S1 is in an off state, in both of a case of the forward direction potential wherein the potential on the rechargeable battery cell side is higher than the potential on the potential measuring section side and another case of the reverse direction potential wherein the potential on the rechargeable battery cell side is lower than the potential on the potential measuring section side, a configuration for prevention of leak of the current or for prevention of reverse flow of current is implemented.

When the high breakdown voltage switch S1 is in an off state as illustrated in FIGS. 3 and 4, where the gate potential and the source potential of each transistor are represented by Vg and Vs, respectively, the potential difference between the gate and the source of the transistors T1, T2 and T3, that is, the gate-source potential, is Vgs.

Figure 5:
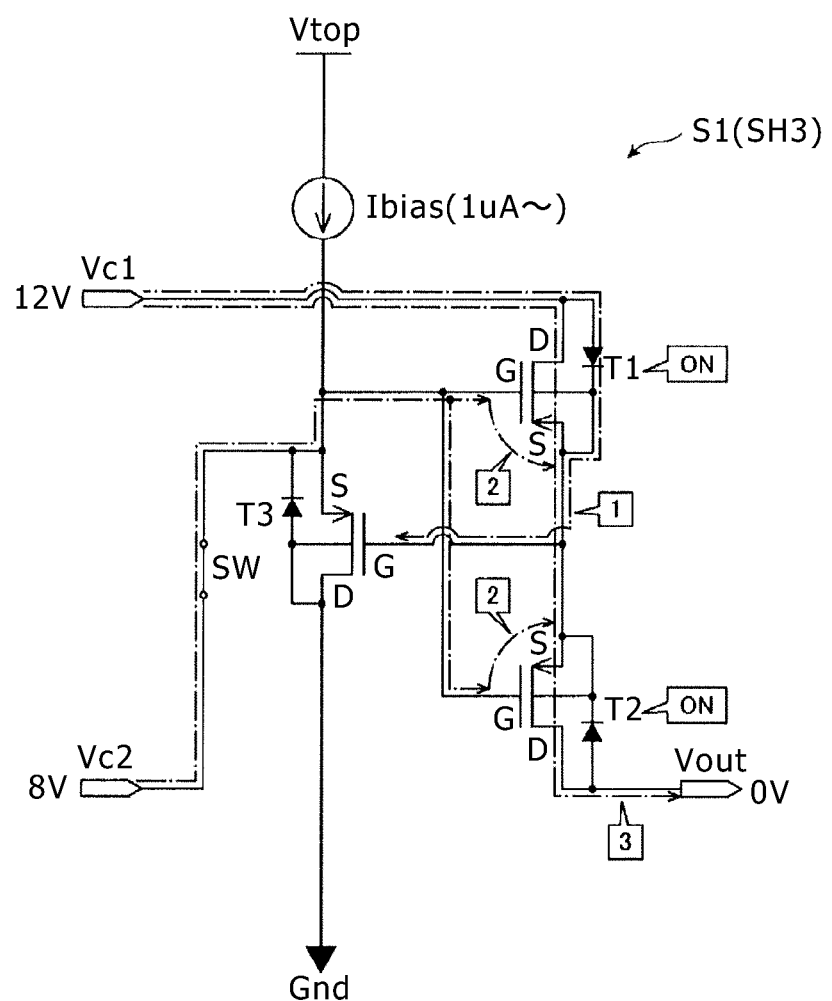
FIG. 5 is a similar view but illustrating an operational situation of a potential at the various portions of the high breakdown voltage switch when the switch is change over from off to on and a forward potential is applied.
Figure 6:
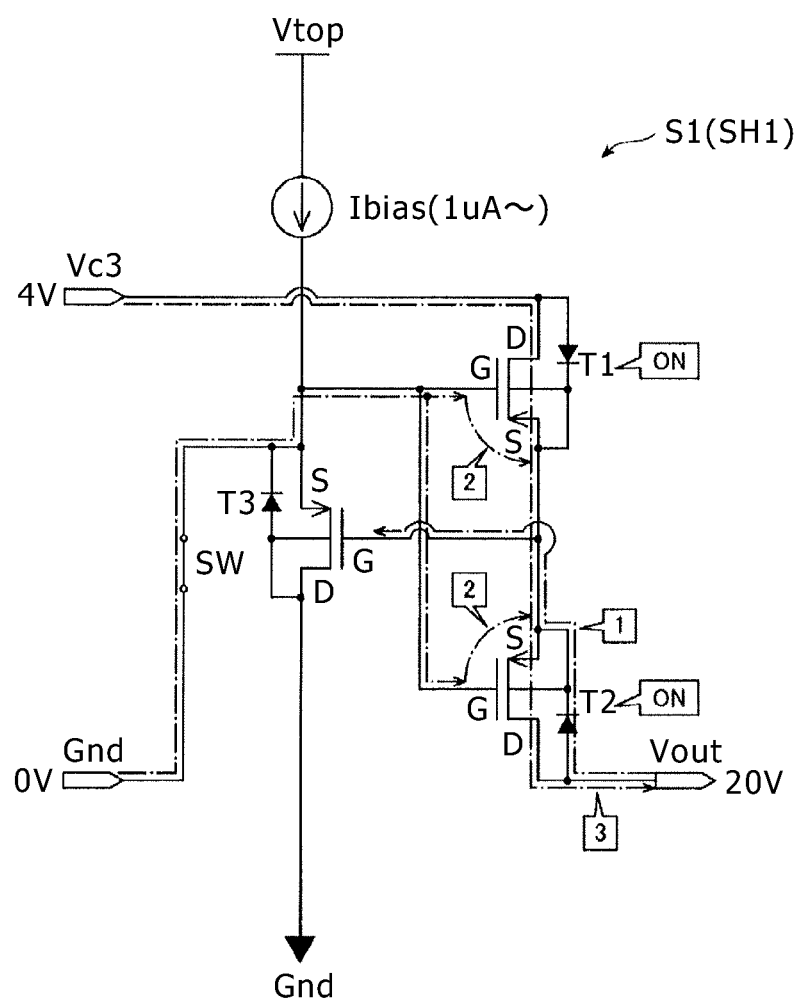
FIG. 6 is a similar view but illustrating an operational situation of a potential at the various portions of the high breakdown voltage switch when the switch is changed over from off to on and a reverse potential is applied.

Now, operation of the bidirectional switch when the high breakdown voltage switch S1 is in an on state is described with reference to FIGS. 5 and 6. FIG. 5 illustrates the positive terminal switch SH3 as an example in the case of the forward direction potential wherein the potential on the rechargeable battery cell side is higher than the potential on the potential measuring section side. FIG. 6 illustrates the positive terminal switch SH1 as an example in the case of the reverse direction potential wherein the potential on the rechargeable battery cell side is lower than the potential on the potential measuring section side.

FIG. 5 illustrates an operational situation of potentials at several portions in the forward direction potential in the case where the switch SW is changed over from off to on. It is to be noted that voltages indicated at the terminals Vc1, Vout and Vc2 are exemplary voltages for indicating that they are in a state in which the potential at the terminal Vc1 on the rechargeable battery cell side is higher than the potential at the terminal Vout of the potential measuring section side, that is, in a potential state in the forward direction, similarly as in FIG. 3.

In the potential state illustrated in FIG. 5, before the switch SW is changed over to on, a potential at the terminal Vc1 acts upon the drain terminal of the transistor T1. Therefore, the source potential of the transistors T1 and T2 is close to the potential at the terminal Vc1 by an action of the parasitic diode of the transistor T1 (numeral 1). Also, the gate potential of the transistor T3 is close to the potential at the terminal Vc1 together with the source potential of the transistors T1 and T2. Meanwhile, the source potential of the transistor T3 is higher by the gate-source voltage Vgs than the potential at the terminal Vc1 due to supply of bias current from the current source I1, and a voltage hither by the gate-source voltage Vgs than the potential at the terminal Vc1 acts also upon the gate of the transistors T1 and T2 (numeral 2).

If the switch SW is changed over from the off state into an on state, then the source terminal of the transistor T3 is connected to the terminal Vc2. Therefore, the gate potential of the transistors T1 and T2 connected to the source terminal of the transistor T3 drops from the potential Vc1, and the transistors T1 and T2 are placed into an on state and the connection between the terminal Vc1 and the terminal Vout is placed into an on state therebetween (numeral 3).

When the switch SW is placed into an on state, the connection destination of the source terminal of the transistor T3 is the gate terminal of the transistors T1 and T2 and the terminal Vc2. Since the voltage range of each rechargeable battery cell is 0 to 4 V, it does not exceed 5 V which is the Vgs breakdown voltage indicated as an example of the low breakdown voltage circuit.

FIG. 6 illustrates an operational situation of potentials at several portions in the reverse direction potential in the case where the switch SW is changed over from off to on. Voltages indicated at the terminals Vc3, Vout and Gnd are exemplary voltages for indicating that they are in a state in which the potential at the terminal Vc3 on the rechargeable battery cell side is lower than the potential at the terminal Vout of the potential measuring section side, that is, in a potential state in the reverse direction, similarly as in FIG. 4. In the present example illustrated, the maximum voltage 20 V of the rechargeable battery cell unit 12 remains at the terminal Vout.

In the potential state illustrated in FIG. 6, before the switch SW is changed over to on, a potential at the terminal Vout acts upon the drain terminal of the transistor T2. Therefore, the source potential of the transistors T1 and T2 is close to the potential at the terminal Vout by an action of the parasitic diode of the transistor T2 (numeral 1). Also, the gate potential of the transistor T3 is close to the potential at the terminal Vout together with the source potential of the transistors T1 and T2. Meanwhile, the source potential of the transistor T3 is higher by the gate-source voltage Vgs than the potential at the terminal Vout due to supply of bias current from the current source I1. Therefore, the voltage higher by the gate-source voltage Vgs than the potential at the terminal Vout acts also upon the gate of the transistors T1 and T2 (numeral 2).

If the switch SW is changed over from the off state to an on state, then the source terminal of the transistor T3 is connected to the ground terminal Gnd. Therefore, the gate potential of the transistors T1 and T2 connected to the source terminal of the transistor T3 drops from the potential at the terminal Vout and the transistors T1 and T2 are placed into an on state. Consequently, the connection between the terminal Vc3 and the terminal Vout is placed into an on state therebetween (numeral 3).

Figure 7:
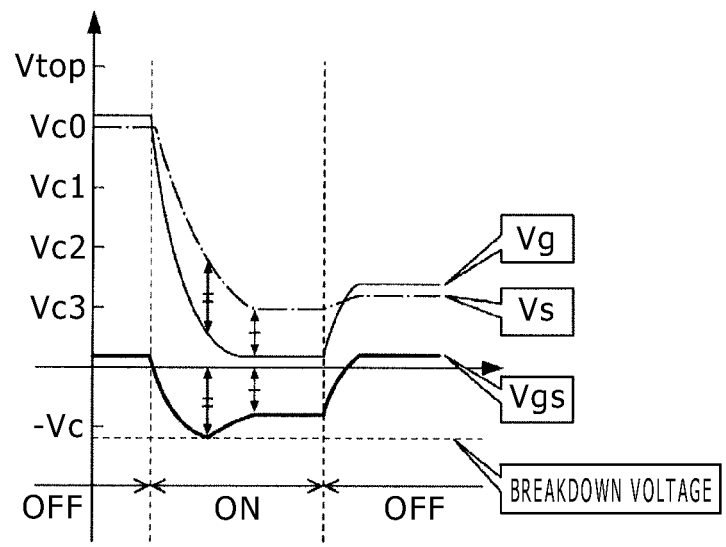

When the switch SW is placed into an on state, the connection destination of the source terminal of the transistor T3 is the gate terminals of the transistors T1 and T2 and the ground terminal Gnd. Therefore, the potential state between the gate and the source of each transistor varies as time passes after the switch SW is placed into an on state. A transition of the gate potential Vg and the source potential Vs of the transistors T1 and T2 and the gate-source voltage Vgs which is the difference between the gate potential Vg and the source potential Vs when the switch SW is changed over from off to on and then changed over from on to off is illustrated in FIG. 7. It is to be noted that FIG. 7 illustrates a transition in a case in which, in an initial state in which the switch SW is off, a voltage corresponding to the potential at the terminal Vc0 remains at the terminal Vout. Also it is to be noted that the voltage at each terminal is sometimes represented by the name of the terminal. For example, the voltage at the terminal Vc3 is represented as Vc3, and the voltage at the ground terminal Gnd is represented as Gnd.

First, in the initial state in which the switch SW is off, the terminal Vc0 acts on the source terminals of the transistors T1 and T2, and a voltage higher by the gate-source voltage Vgs than the terminal Vc0 acts on the gate terminals of the transistors T1 and T2. In other words, the source potential Vs=Vc0 and the gate potential Vg=Vc0+Vgs, and the gate-source voltage is Vgs.

If the switch SW is changed over to on, then since the source terminal of the transistor T3 is connected to the ground terminal Gnd, the gate potential Vg of the transistors T1 and T2 drops suddenly toward the ground potential Gnd. At this time, since the transistors T1 and T2 are changed over to an on state upon the drop of the gate potential Vg, the source potential Vs of the transistors T1 and T2 drops suddenly toward the potential Vc3 in such a manner as to follow up the gate potential Vg. Then, the gate potential Vg stabilizes in the proximity of the ground potential Gnd and the source potential Vs stabilizes in the proximity of the potential Vc3. The gate-source voltage Vgs in the stable state is equal to the difference between the potential Vc3 and the ground potential Gnd, or in other words, Vgs≈Vc3−Gnd, and this does not exceed the Vgs breakdown voltage.

Meanwhile, within a transition period after the gate potential Vg begins to drop until the source potential Vs stabilizes, the gate-source voltage Vgs sometimes increases. However, since the gate-source voltage Vgs drops suddenly following up the gate potential Vg, the width of the increase is suppressed and the source potential Vs can be kept within the range of the Vgs breakdown voltage.

If the switch SW is thereafter changed over from on to off, then the gate-source voltage Vgs increases by the bias current from the current source I1 to place the transistors T1 and T2 into an off state, and the gate potential Vg stabilizes in a state in which it is higher by the gate-source voltage Vgs than the source potential Vs.

Accordingly, with the high breakdown voltage switch S1 having such a basic configuration as described above, by a low breakdown voltage Vgs circuit, leakage or reverse flow of current when the high breakdown voltage switch S1 is off can be prevented and action as a bidirectional switch can be implemented when the high breakdown voltage switch S1 is on. With such a high breakdown voltage switch as just described, the circuit area can be reduced from that of ordinary high breakdown voltage switches, and consequently, reduction in cost based on reduction in power and reduction in area can be achieved. Further, since the transistors which configure the high breakdown voltage switch are configured as low Vgs transistors, they can be formed in the same process together with other low breakdown voltage transistors such as controlling transistors making the film thickness equal among gate oxide films of the transistors. Accordingly, reduction in cost for manufacturing a wafer can be possible.

Figure 8:
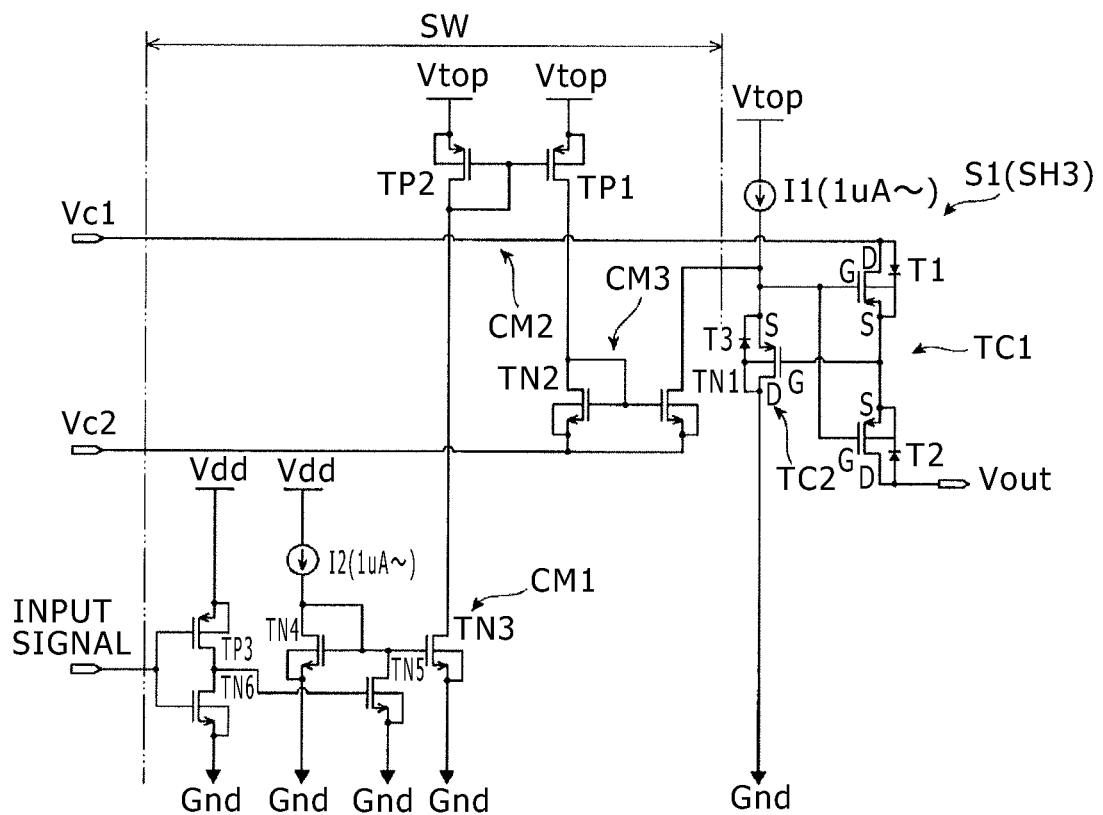
FIG. 8 is a circuit diagram showing an example of a configuration of a control circuit including the high breakdown voltage switch of FIG. 2.

Now, an example of a configuration of the switch or switch circuit SW for controlling the high breakdown voltage switch S1 described above to on/off is described. FIG. 8 shows an example of a circuit configuration of the switch SW including the high breakdown voltage switch S1 having the transistors T1, T2 and T3 described above. It is to be noted that FIG. 8 shows a positive terminal switch SH3 for turning on/off between the terminal Vc1 and the terminal Vout. Further, as regards the transistors in FIG. 8, a PMOS transistor is denoted by TP and an NMOS transistor is denoted by TN, and each transistor is denoted by a reference character configured from such TP or TN and a number.

The switch SW is configured from transistors TP3 and TN6 to which an input signal for switching the high breakdown voltage switch S1 on/off is inputted, a transistor TN5 connected at the gate thereof to the drain terminal of the transistors TP3 and TN6, and first, second and third current mirrors CM1, CM2 and CM3.

The transistors TP3 and TN6 are connected in series with the drain terminals thereof connected to each other, and a power supply voltage Vdd for a low breakdown voltage circuit is supplied to the source terminal of the transistor TP3 while the ground terminal Gnd is connected to the source terminal of the transistor TN6. While the power supply voltage Vdd is an arbitrary voltage within the voltage range of the low breakdown voltage circuit, it can be set, for example, to approximately 3 V. To the gate terminal of the transistors TP3 and TN6, an input signal (Low/High) for switching the high breakdown voltage switch S1 on/off is inputted, and the drain terminals of the transistors TP3 and TN6 connected to each other are connected to the gate terminal of the transistor TN5. The transistor TN5 is connected at the drain terminal thereof to the gate terminal of transistors TN3 and TN4 which configure the first current mirror CM1 and is connected at the source terminal thereof to the ground terminal Gnd.

The first current mirror CM1 is formed from the NMOS transistors TN3 and TN4 connected to each other at the gate terminal thereof. The transistor TN3 is connected at the drain terminal thereof to the drain terminal of a transistor TP2 of the second current mirror CM2 while the transistor TN4 is connected at the drain terminal thereof to a current source I2. The current source I2 supplies very low bias current of approximately 1 µA to the drain terminal of the transistor TN4. The transistors TN3 and TN4 are connected at the source terminals thereof commonly to the ground terminal Gnd. The drain terminal of the transistor TN4 and the gate electrodes of the transistors TN3 and TN4 are connected to each other to configure the first current mirror CM1.

The second current mirror CM2 is formed from PMOS transistors TP1 and TP2 connected to each other at the gates terminal thereof. To the source terminal of both of the transistors TP1 and TP2, a maximum voltage Vtop of the rechargeable battery cell unit 12 is supplied. The transistor TP2 is connected at the drain terminal thereof to the drain terminal of the transistor TN3 of the first current mirror CM1 while the transistor TP1 is connected at the drain terminal thereof to the drain terminal of a transistor TN2 of the third current mirror CM3. Further, the drain terminal of the transistor TP2 and the gate electrodes of the transistors TP1 and TP2 are connected to each other to configure the second current mirror CM2.

The third current mirror CM3 is formed from the NMOS transistors TN1 and TN2 having gate terminals connected to each other. The transistor TN2 is connected at the drain terminal thereof to the drain terminal of the transistor TP1 of the second current mirror CM2 while the transistor TN1 is connected at the drain terminal thereof to the source terminal of the transistor T3 of the high breakdown voltage switch S1. The drain terminal of the transistor TP2 and the gate electrodes of the transistors TN1 and TN2 are connected to each other to configure the third current mirror CM3.

Operation of the switch SW configured in such a manner is described. First, when the input signal has the Low level, the transistor TP3 is on and the transistor TN6 is off. At this time, the power supply voltage Vdd acts upon the gate terminal of the transistor TN5 to turn on the transistor TN5, and current of the current source I2 flows down to the ground terminal Gnd through the transistor TN5. Therefore, the gate potential of the transistors TN3 and TN4 drops to turn off the transistors TN3 and TN4. Consequently, none of the first current mirror CM1, second current mirror CM2 and third current mirror CM3 operates. In other words, the switch SW exhibits an off state, and the high breakdown voltage switch S1 exhibits an off state.

On the other hand, when the input signal has the High level, the transistor TP3 is off and the transistor TN6 is on. At this time, the source terminal of the transistor TN5 is connected to the ground terminal Gnd and the source potential drops, and consequently, the transistor TN5 is turned off. Therefore, the gate potential of the transistors TN3 and TN4 rises to turn on the transistors TN3 and TN4, and the first, second and third current mirrors CM1, CM2 and CM3 operate and current flows through the transistors TN3/TN4, TP1/TP2 and TN1/TN2 which configure the first, second and third current mirrors CM1, CM2 and CM3, respectively. In other words, the switch SW is placed into an on state and the high breakdown voltage switch S1 is placed into an on state.

At this time, the current to flow through the transistor TN1 can be set by adjusting the current source I2. In the case where the first to third current mirrors CM1 to CM3 have a 1:1 configuration and the current values of the current sources I1 and I2 are represented by $I_1$ and $I_2$, respectively, when $I_2 > I_1$, extraction of current occurs and the source potential of the transistor T3 of the high breakdown voltage switch S1 and the gate potential of the transistors T1 and T2 drop. The dropping speed of the gate potential $V_g$ of the transistors T1 and T2 can be set by adjusting the difference or ratio between the current $I_1$ and the current $I_2$.

Accordingly, with the switch SW of such a configuration as described above, the gate-source voltage Vgs of the transistors T1 and T2 can be included in the range of the Vgs breakdown voltage with a margin (refer to FIG. 7). It is to be noted that, as apparent from the configuration of FIG. 8, all of the transistors which configure the switch SW operate in a current mirror fashion, and therefore, a high breakdown voltage is not required for the gate-source voltage Vgs. Accordingly, with the switch SW described above and the high breakdown voltage switch S1 including the switch SW, a switch which has a low breakdown voltage Vgs configuration and can carry out bidirectional switching operation with a high breakdown voltage can be provided.

Now, an example of an application of the switch controlling circuit described hereinabove with reference to FIG. 8 is described with reference to FIGS. 9 and 10. The present configuration example includes two switches SW1 and SW2 for controlling operation of two high breakdown voltage switches S1 and S1-2. The high breakdown voltage switch S1 includes a positive terminal switch SH3 for turning on/off the connection between the terminal Vc1 and the terminal Vout while the high breakdown voltage switch S1-2 includes the positive terminal switch SH2 for turning on/off the connection between the terminal Vc2 and the terminal Vout. FIG. 10 shows components from an inputting section of a control signal to the first current mirror section in FIG. 9.

Figure 9:
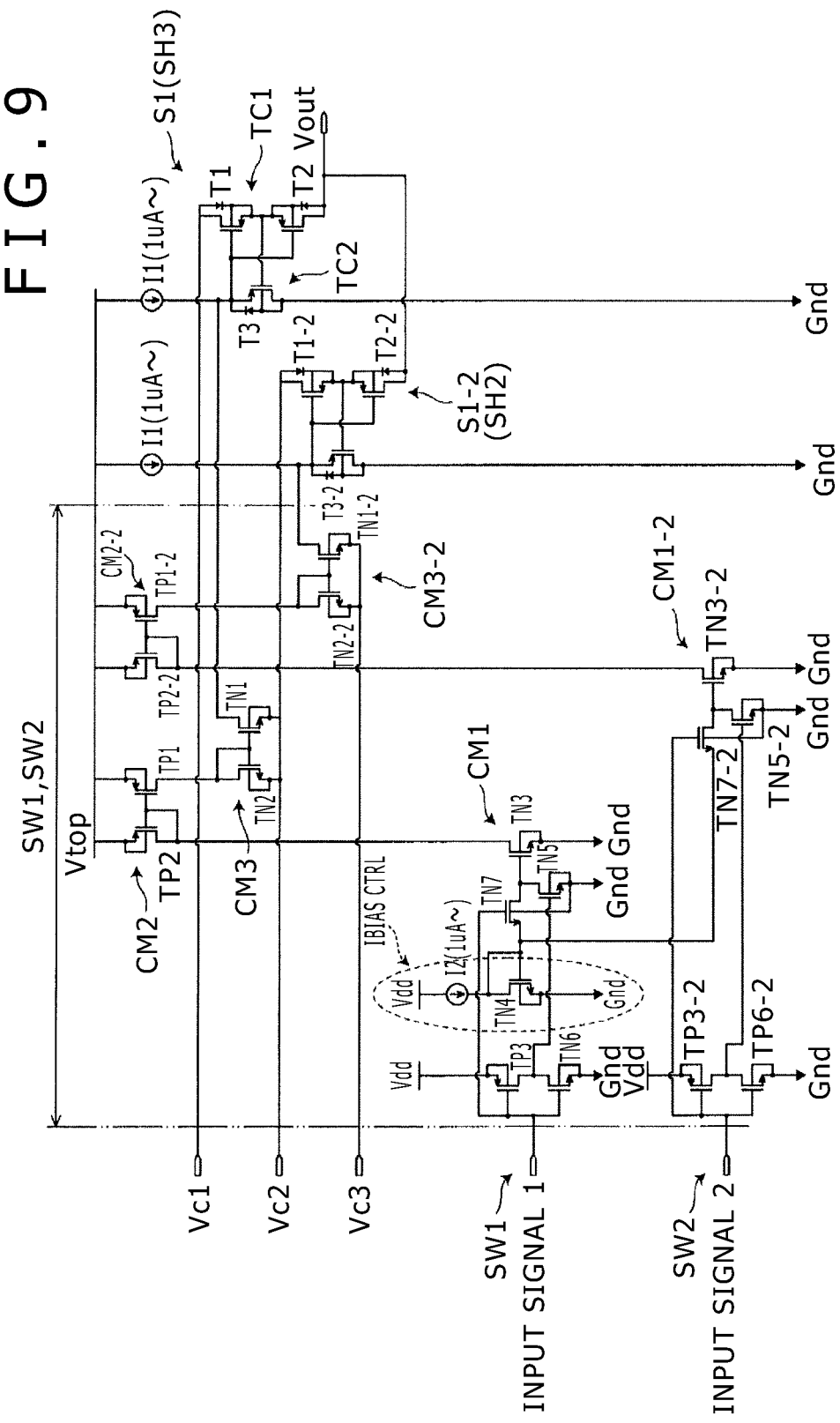
FIG. 9 is a circuit diagram showing an example of an application of the high breakdown voltage switch of FIG. 2.
Figure 10:
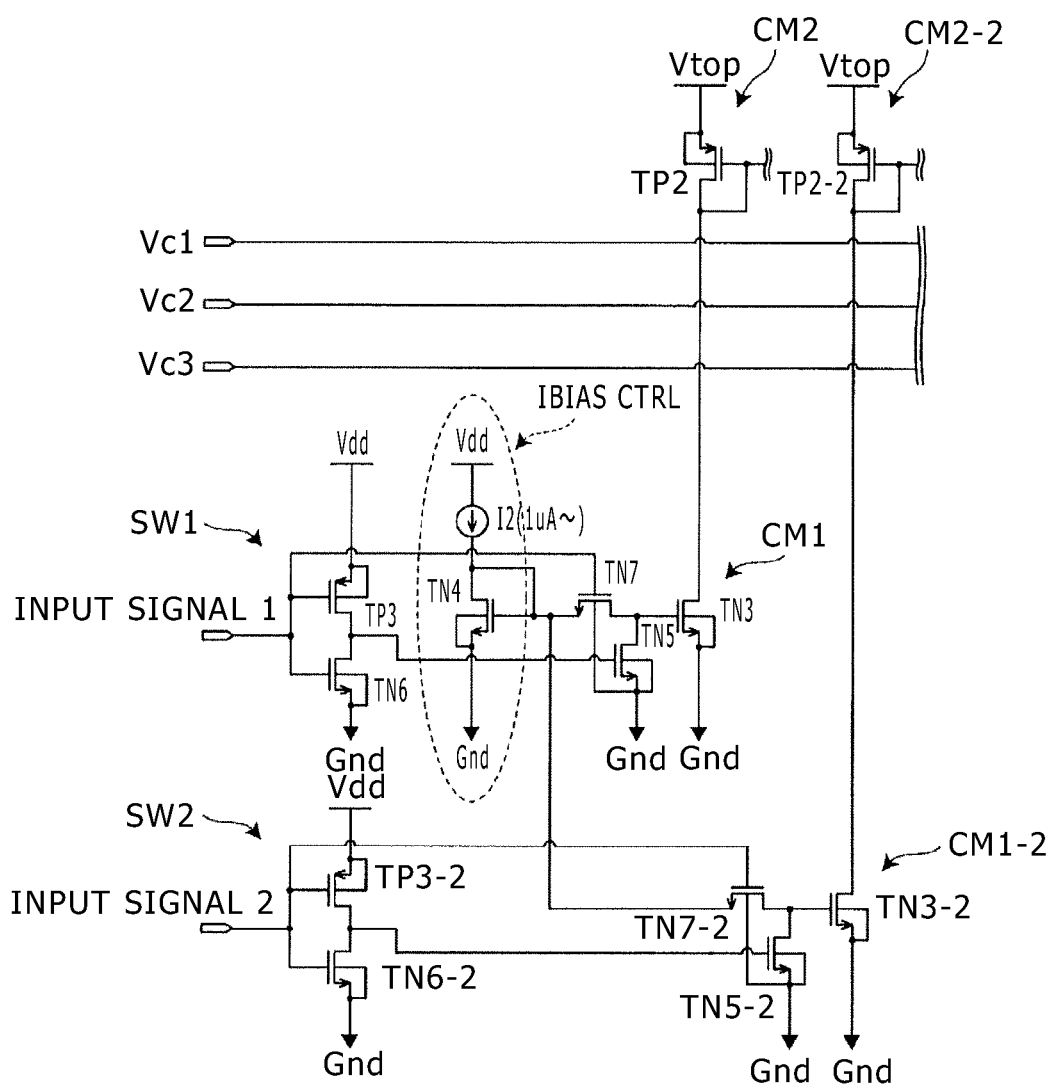
FIG. 10 is a view particularly showing components from an inputting section of a control signal to a first current mirror section in the application example of FIG. 9.

It is to be noted that, in FIGS. 9 and 10, those components of the high breakdown voltage switch S1-2 which correspond to those of the high breakdown voltage switch S1 are denoted by like reference characters to those of the high breakdown voltage switch S1 with "−2" added thereto to clearly indicate the corresponding relationship between them. For example, the transistor corresponding to the transistor T3 of the high breakdown voltage switch S1 is denoted by T3-2; the transistor corresponding to the transistor TP2 is denoted by TP-2; and the transistor corresponding to the transistor TN5 is denoted by TN5-2.

The second current mirror CM2 and the third current mirror CM3 shown in FIG. 9 are collectively referred to as a first current mirror circuit. The transistor TN3 is a first transistor connected to the transistor TP2 which the second current mirror of the first current mirror circuit has. To the gate terminal of the transistor TN3, a first switch and a second switch are connected. In the present embodiment, the first switch and the second switch are configured from transistors TN7 and TN5, respectively. The transistor TN7 is connected at the drain terminal thereof to the gate terminal of the transistor TN3 and at the source terminal thereof to the gate terminal of the transistor TN4. An input signal 1 is inputted to the gate terminal of the transistor TN7. The transistor TN5 is connected at the drain terminal thereof to the gate terminal of the transistor TN3 and grounded at the drain terminal thereof. The transistor TN5 is connected at the gate terminal thereof to the drain terminal of the transistors TP3 and TN6.

The switch S1, first current mirror circuit, transistor TN3 which is the first transistor, and transistors TN5 and TN7 which are the first and second switches, are collectively referred to as a switch circuit. The switch controlling circuit shown in FIG. 9 has a plurality of such switch circuits. The transistor TN4 is referred to as a second transistor. When the transistor TN7 which is the first switch is turned on and the transistor TN5 which is the second switch is turned off, the gate terminal of the transistor TN4 and the gate terminal of the transistor TN3 are connected to each other. Thus, the transistors TN4 and TN3 operate as the first current mirror CM1 which is a second current mirror circuit. Consequently, current flows through the first to third current mirrors CM1 to CM3, and the potential at the source terminal of the second transistor circuit becomes high and the switch S1 is turned on. On the other hand, when the transistor TN7 is turned off and the transistor TN5 is turned on, the gate terminal of the transistor TN4 and the gate terminal of the transistor TN3 are disconnected from each other and the gate terminal of the transistor TN3 is grounded. Consequently, no current flows through the current mirrors CM2 and CM3, and the potential at the source terminal of the second transistor becomes low and the high breakdown voltage switch S1 is turned off.

For example, as seen in FIG. 8, if the first current mirror CM1 and a current source are provided for each of the high breakdown voltage switches S1 and S1-2, then a number of current sources equal to the number of switches may be required and high power consumption may be required. Therefore, as seen in FIG. 9, the current source and the transistor TN4 of the first current mirror CM1 are used commonly by a plurality of switch circuits such that, by changing over on/off of the first and second switches, the plural high breakdown voltage switches S1 and S1-2 can be changed over between on and off without using a plurality of current sources.

In the following, details are described. As apparent from comparison between FIGS. 8 and 9, the circuit configuration of FIG. 9 wherein the switch S1 is connected to the source terminal of the transistor T3 through the second current mirror CM2 to third current mirror CM3 in the high breakdown voltage switch S1 is similar to that of the switch SW shown in FIG. 8. This similarly applies also to the high breakdown voltage switch S1-2. Meanwhile, the circuit configuration of the portion of the inputting section of the input signal 1 to the first current mirror CM1 for turning on/off the switch SW1 is a little different from that of the switch SW shown in FIG. 8. This similarly applies also to the switch SW2. The difference is described below with reference to FIG. 10.

In the switch SW1, the inputting section formed from the transistors TP3 and TN6, first current mirror CM1 formed from the transistors TN3 and TN4, transistor TN5 for flowing down the current flowing through the first current mirror CM1 and so forth have a basic configuration similar to that described hereinabove. However, in the switch SW1, the NMOS transistor TN7 is provided in a circuit which connects the gate terminals of the transistors TN3 and TN4 to each other. In particular, the transistor TN7 is connected at the drain terminal thereof to the gate terminal of the transistor TN3 and at the source terminal thereof to the gate terminal of the transistor TN4. The transistor TN7 is connected at the gate terminal thereof to the gate terminal of the transistors TP3 and TN6, and the input signal 1 (Low/High) is inputted to the gate terminal of the three transistors TP3, TN6 and TN7.

In the switch SW2, the inputting section formed from the transistors TP3-2 and TN6-2 is similar to that of the switch SW1. Also, the circuit configuration of the transistors TN3-2, TN5-2 and TN7-2 is similar to that of the circuit of the transistors TN3, TN5 and TN6 of the switch SW1. The transistor TN7-2 is connected at the source terminal thereof to a connection point between the source terminal of the transistor TN7 and the gate terminal of the transistor TN4 of the switch SW1. In other words, the first current mirror CM1-2 of the switch SW2 is formed from the transistor TN4 and the transistor TN3-2 connected to each other through the transistor TN7-2. The transistor TN7-2 is connected at the gate terminal thereof to the gate terminals of the transistors TP3-2 and TN6-2, and an input signal 2 (High/Low) is inputted to the gate terminal of the three transistors TP3-2, TN6-2 and TN7-2.

Operation of the switches SW1 and SW2 configured in such a manner as described above is described. First, when the input signal 1 has the Low level, the transistor TP3 is on and the transistor TN6 is off. At this time, the power supply voltage Vdd acts on the gate terminal of the transistor TN5 to turn on the transistor TN5 while the transistor TN7 is in an off state because the gate potential of the transistor TN7 is Low. Therefore, the first, second and third current mirrors CM1, CM2 and CM3 of the switch SW1 do not operate. In other words, the switch SW1 is in an off state and the high breakdown voltage switch S1 is in an off state.

The switches SW1 and SW2 operate similarly also when the input signal 2 has the Low level. In particular, the transistor TP3-2 is in an on state and the transistor TN6-2 is in an off state while the transistor TN5-2 is in an on state and the transistor TN7-2 is in an off state. Therefore, the first, second and third current mirrors CM1-2, CM2-2 and CM3-2 of the switch SW2 do not operate. In other words, the switch SW2 exhibits an off state and the high breakdown voltage switch S1-2 exhibits an off state.

When the input signal 1 has the High level, the transistor TP3 is off and the transistor TN6 is on. At this time, the gate terminal of the transistor TN5 is connected to the ground terminal Gnd and the gate potential drops, and consequently, the transistor TN5 is turned off. Meanwhile, the gate potential of the transistor TN7 becomes High and the transistor TN7 is turned on. Therefore, the gate potential of the transistors TN3 and TN4 rises and the transistors TN3 and TN4 are turned on. Consequently, the first, second and third current mirrors CM1, CM2 and CM3 operate and current flows through the transistors TN3/TN4, TP1/TP2 and TN1/TN2 which configure the current mirrors. In particular, the switch SW1 is placed into an on state and the high breakdown voltage switch S1 is placed into an on state. As a result, the terminal Vc1 and the terminal Vout are connected to each other, and the potential at the terminal Vc1 is outputted to the terminal Vout.

The switches SW1 and SW2 operate similarly also when the input signal 2 is High. In particular, the transistor TP3-2 is off and the transistor TN6-2 is on while the transistor TN5-2 is off and the transistor TN7-2 is on. Therefore, the first, second and third current mirrors CM1-2, CM2-2 and CM3-2 of the switch SW2 operate, and the switch SW2 is placed into an on state and the high breakdown voltage switch S1-2 is placed into an on state. As a result, the terminal Vc2 and the terminal Vout are connected to each other, and the potential at the terminal Vc2 is outputted to the terminal Vout. It is to be noted that the high breakdown voltage switches S1 and S1-2 alternatively connect the terminals on the rechargeable battery cell side and the terminals on the potential measuring section side, and the input signal 1 and the input signal 2 do not simultaneously exhibit the High level.

In regard to the application example of the switch controlling circuit configured in such a manner as described above, the high breakdown voltage switch S1 can be summarized in the following manner.

The high breakdown voltage switch S1 includes a switch circuit described below and the transistor TN4. The switch circuit includes a first transistor circuit TC1 formed from two transistors T1 and T2 connected in series between a terminal Vc1 and a ground terminal Gnd, and a second transistor circuit TC2 connected at the gate terminal thereof to the source terminal of the transistors T1 and T2 and at the source terminal thereof to the gate terminal of the transistors T1 and T2. The switch circuit further includes current mirrors CM2 and CM3 connected to the source terminal of the second transistor circuit TC2, a transistor TN3 connected at the drain terminal thereof to the current mirrors CM2 and CM3, and a transistor TN5 connected at one terminal thereof to the gate terminal of the transistor TN3 and grounded at the other terminal thereof. The transistor TN4 is connected at the gate terminal thereof to the other terminal of transistors TN7 or TN7-2 of a plurality of switch circuits.

Then, by changing over the transistor TN7 between on and off, it is changed over whether or not the transistor TN3 and the transistor TN4 operate as the first current mirror CM1. By changing over the transistor TN5 between on and off to change over whether or not current is to be supplied to the first, second and third current mirrors CM1, CM2 and CM3, the potential at the source terminal of the second transistor circuit TC2 is changed over between the high and low levels. While the foregoing description is the summary regarding the high breakdown voltage switch S1, this similarly applies also to a high breakdown voltage switch S2 hereinafter described.

With such a configuration as described above, by commonly using a current controlling circuit IBIAX_CTRL for controlling extraction current upon connection operation of a plurality of high breakdown voltage switches, the current source 12 can be reduced. Consequently, reduction in element size and reduction in power can be anticipated.

A-2. Second Configuration Form of the High Breakdown Voltage Switch

Figure 11:
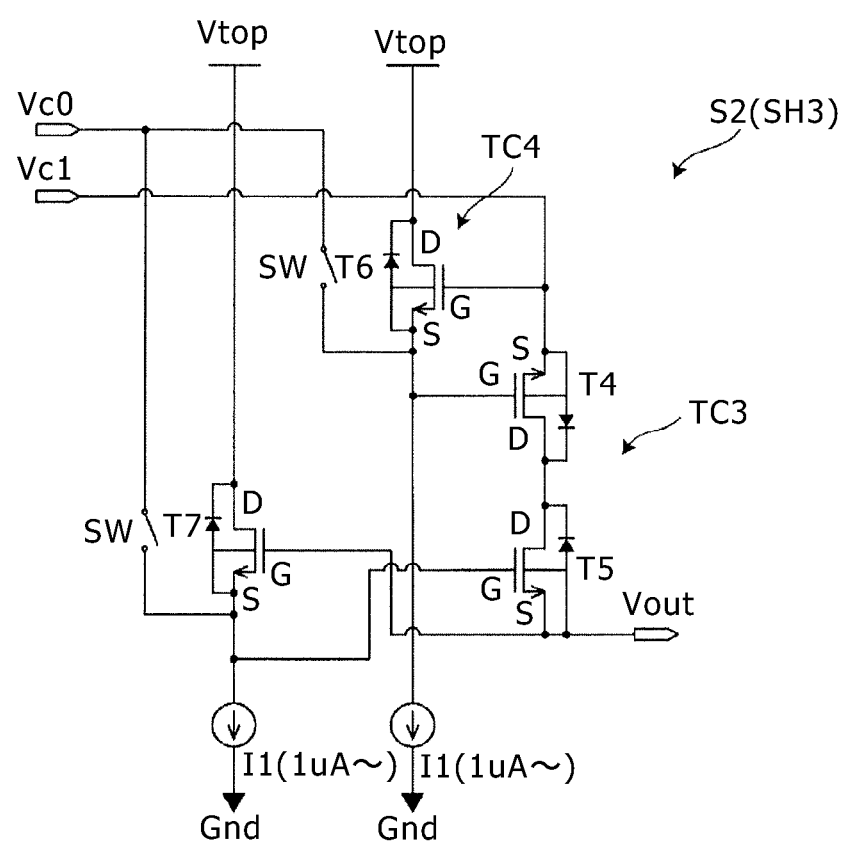
FIG. 11 is a circuit diagram showing a basic configuration of a high breakdown voltage switch according to a second configuration form.

Now, a high breakdown voltage switch S2 of a second configuration form is described briefly with reference to FIG. 11 which shows a basic configuration of the high breakdown voltage switch S2. While the high breakdown voltage switch S1 of the first configuration form described hereinabove is configured principally from PMOS transistors, the switch S2 of the present configuration form is configured principally from NMOS transistors. In FIG. 11, as an example of the high breakdown voltage switch S2 for turning on/off the connection between the terminal on the rechargeable battery cell side and the terminal on the potential measuring section side, a positive terminal switch SH3 for turning on/off the connection between the terminal Vc1 and the terminal Vout is shown.

The high breakdown voltage switch S2 includes a first transistor circuit TC3 formed from two transistors T4 and T5 connected in series between the terminal Vc1 and the terminal Vout, and a second transistor circuit TC4 formed from two transistors T6 and T7 connected at the gate terminal thereof to the source terminal of the transistors T4 and T5 and at the source terminal thereof to the gate terminal of the transistors T4 and T5.

In the high breakdown voltage switch S2 of the present configuration form, the drain terminals of the two NMOS transistors T4 and T5 are opposed and connected in series to each other. One of the transistors T4 and T5 connected in series, that is, the transistor T4, is connected at the source terminal thereof to the terminal Vc1 while the other one of the transistors T4 and T5, that is, the transistor T5, is connected at the source terminal thereof to the terminal Vout. In other words, the transistors T4 and T5 configure a high breakdown voltage switch which opens and closes the connection between the terminal Vc1 and the terminal Vout. The transistor T4 is connected at the source terminal thereof to the gate terminal of the transistor T6 while the transistor T5 is connected at the source terminal thereof to the gate terminal of the transistor T7.

The transistor T6 is connected at the source terminal thereof to the current source I1 and also to the gate terminal of the transistor T4. The transistor T7 is connected at the source terminal thereof to the current source I1 and also to the gate terminal of the transistor T4. Further, the transistor T6 is connected at the source terminal thereof to the terminal Vc0 through a switch SW while the transistor T7 is connected at the source terminal thereof to the terminal Vc0 through another switch SW. The two switches SW are controlled between on and off simultaneously. The transistor T6 and the transistor T7 are connected at the drain terminal thereof individually to circuits of a potential Vtop. The current source I1 and the switches SW are similar to the current source I1 and the switch SW described hereinabove, respectively.

As can be recognized from the configuration just described, the high breakdown voltage switch S2 is configured such that, from the configuration that the two NMOS transistors T4 and T5 are connected in series to each other at the drain terminals thereof, a transistor and a switch are provided for each of the source terminals provided separately at two locations. Thus, the high breakdown voltage switch S2 exhibits operation and effects similar to those of the high breakdown voltage switch S1 described hereinabove. Further, according to the present configuration, since the gate potential of the transistors T4 and T5 acts in a direction in which it is reduced by the respective current sources I1, the potential at the terminal of the rechargeable battery cell side which exhibits a lower potential such as the terminal Vc3 or the ground terminal Gnd, is outputted to the terminal Vout so that, even in such a case that a potential is measured, stable operation can be anticipated.

A-3. Third Configuration Form of the High Breakdown Voltage Switch

Figure 12:
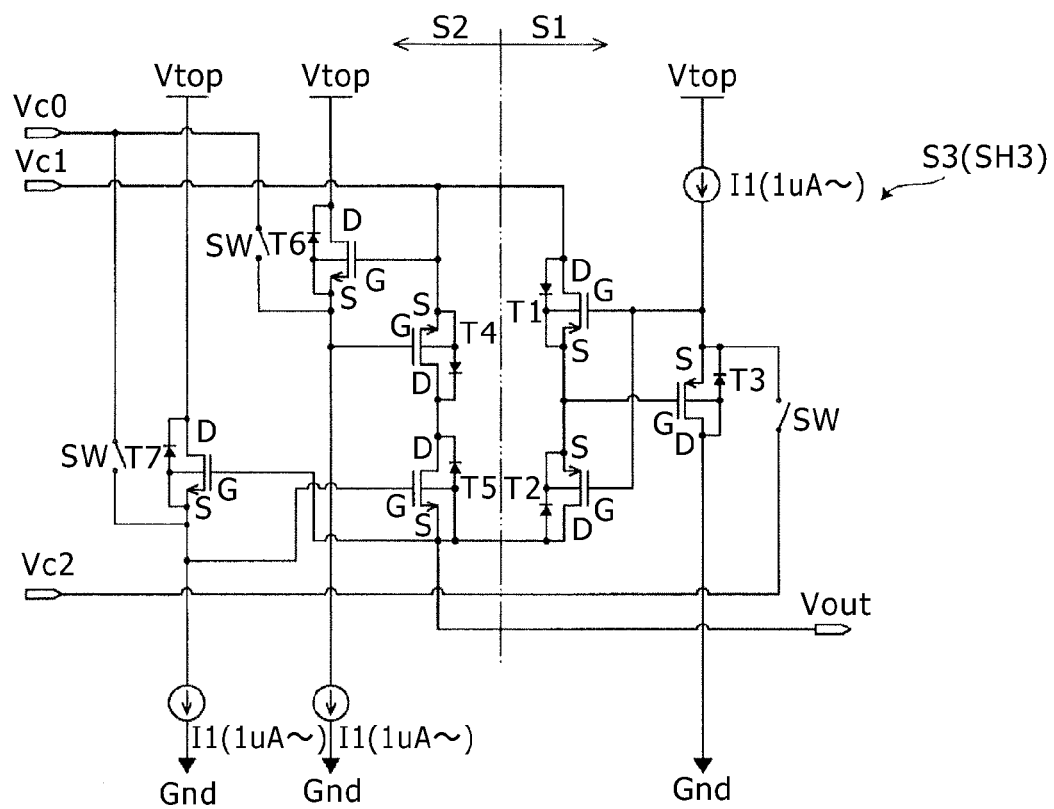
FIG. 12 is a circuit diagram showing a basic configuration of a high breakdown voltage switch according to a third configuration form.

Now, a high breakdown voltage switch S3 of a third configuration form is described briefly with reference to FIG. 12 which shows a basic configuration of the high breakdown voltage switch S3. The high breakdown voltage switch S3 of the present configuration form is configured by integration of the high breakdown voltage switch S1 of the first configuration form and the high breakdown voltage switch S2 of the second configuration form described hereinabove. In particular, a portion of the high breakdown voltage switch S3 shown in a right side region in FIG. 12 is similar in configuration to the high breakdown voltage switch S1 configured principally from PMOS transistors T1, T2 and T3. Meanwhile, the other portion of the high breakdown voltage switch S3 shown in a left side region in FIG. 12 is similar in configuration to the high breakdown voltage switch S2 configured principally from NMOS transistors T4, T5, T6 and T7.

Accordingly, also the high breakdown voltage switch S3 having such a configuration as described above operates similarly to the high breakdown voltage switches S1 and S2 described hereinabove and can achieve similar effects to those described hereinabove. Further, with the present configuration form, irrespective of whether a terminal is a terminal having a high potential or a terminal having a low potential of the rechargeable battery cell side, it can output the potential of the rechargeable battery cell to the terminal Vout so that potential measurement by the potential measuring section can be carried out stably. Consequently, the measuring cell selection section 111 can be configured from high breakdown voltage switches S3 of the same circuit configuration without depending upon the potential on the rechargeable battery cell side, and equalization in circuit configuration can be implemented.

B. Rechargeable Battery Module of the Second Embodiment

Figure 13:
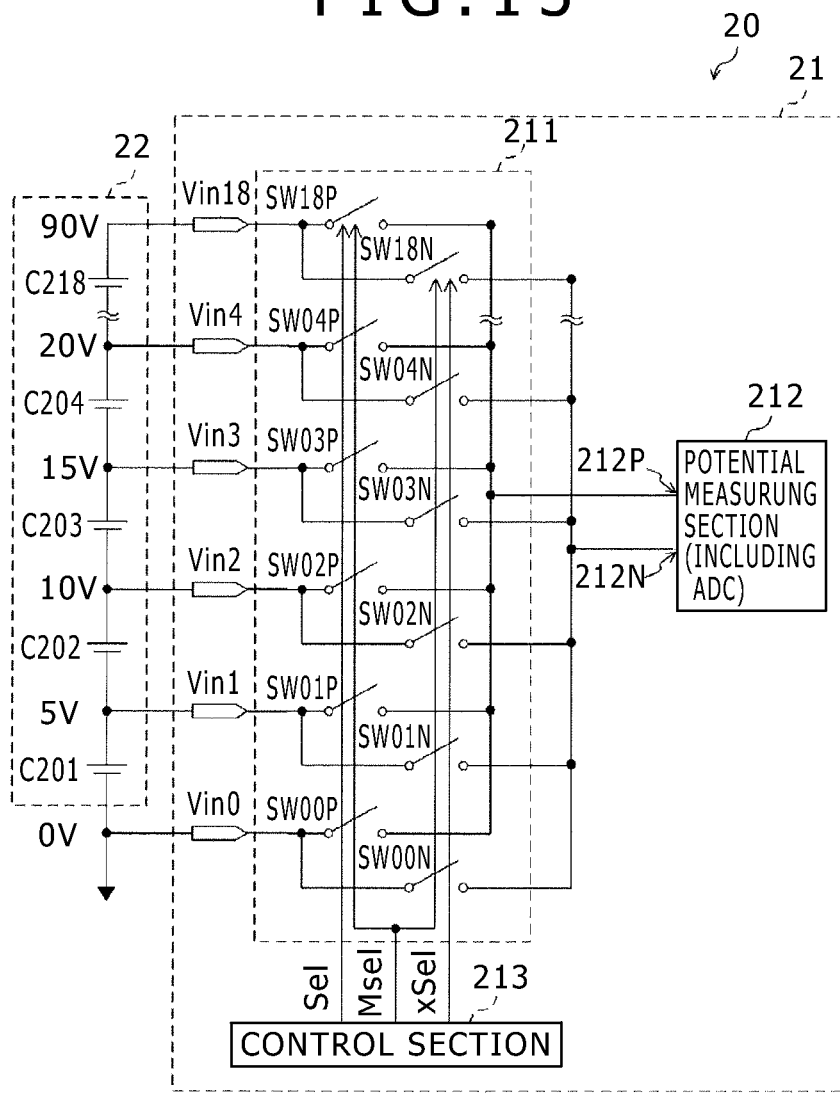
FIG. 13 is a circuit diagram showing a general configuration of a rechargeable battery module according to a second embodiment.
Figure 14:
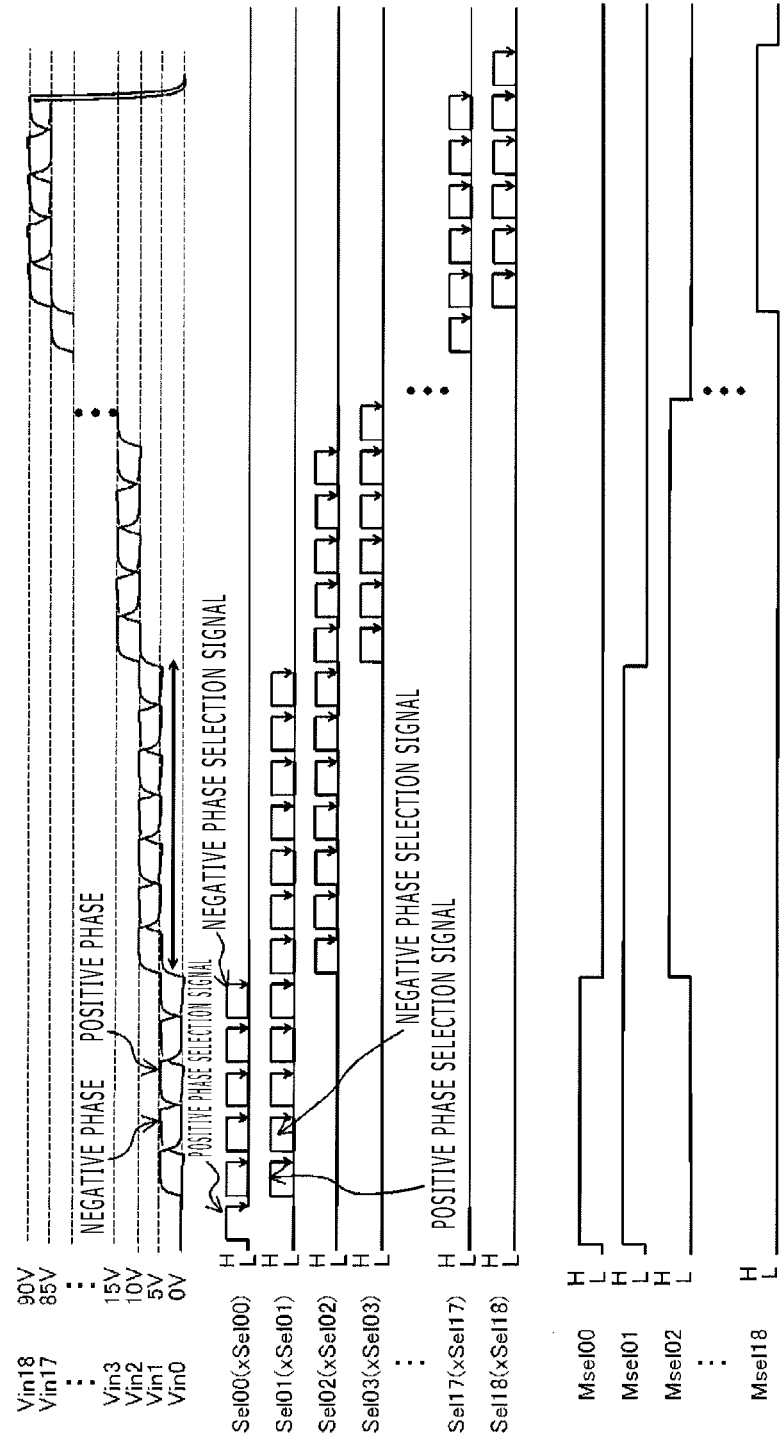
FIG. 14 is a time chart illustrating operation of the rechargeable battery module of FIG. 13.

A configuration and operation of a rechargeable battery module are described with reference to FIGS. 13 and 14. FIG. 13 shows a general configuration of a rechargeable battery module 20, and FIG. 14 is a time chart illustrating an example of operation of the rechargeable battery module 20. Referring first to FIG. 13, the rechargeable battery module 20 shown includes a rechargeable battery cell unit 22 having a plurality of rechargeable battery cells, and a battery monitor unit 21 for selecting a rechargeable battery cell of the rechargeable battery cell unit 22 and measuring a state of the selected rechargeable battery cell.

The rechargeable battery cell unit 22 has a plurality of rechargeable battery cells C201, C202, . . . , C218. The rechargeable battery cells C201, C202, . . . , C218 are secondary battery cells which can carry out charging/discharging repetitively like, for example, a lithium-ion battery cell. It is to be noted that, in FIG. 13, as an example of a plurality of rechargeable battery cells, 18 rechargeable battery cells C201 to C218 are successively connected in series from the low voltage side.

The rechargeable battery cells C201 to C218 have an upper limit voltage of 5 V. Therefore, in a state in which the rechargeable battery cells are fully charged, the rechargeable battery cell C201 exhibits 0 V on the negative terminal side thereof and exhibits 5 V on the positive terminal side thereof. The rechargeable battery cell C218 exhibits 85 V on the negative terminal side thereof and exhibits 90 V on the positive terminal side thereof. It is to be noted that potentials of rechargeable battery cells and the number of connected rechargeable battery cells, which is 18 in the present embodiment, are exemplary values, and the range of voltages and the connected number may be different from those described hereinabove.

The battery monitor unit 21 is shown as an example of a charge monitoring apparatus and includes a measuring cell selection section 211, a potential measuring section 212 and a control section 213. The measuring cell selection section 211 selects a rechargeable battery cell to be measured. The potential measuring section 212 measures the potential of the rechargeable battery cell selected by the measuring cell selection section 211. The control section 213 is implemented by a logic circuit, a microcomputer or the like and instructs the measuring cell selection section 211 of a measuring cell to be selected.

In the present second embodiment, the potential measuring section 212 has a $\Delta\Sigma$ type ADC (Analog Digital Converter) for measuring a voltage using differential signals as an example of a configuration for carrying out voltage measurement. The potential measuring section 212 includes a positive phase input terminal 212P for inputting a voltage signal of the positive phase and a negative phase input terminal 212N for inputting a voltage signal of the negative phase. The potential measuring section 212 measures a voltage of a selected rechargeable battery cell based on a voltage inputted to the positive phase input terminal 212P and a voltage inputted to the negative phase input terminal 212N.

The measuring cell selection section 211 includes positive phase switches SW00P to SW18P and negative phase switches SW00N to SW18N. The positive phase switch SW00P connects a terminal Vin0 connected to the negative terminal side of the rechargeable battery cell C201 and the positive phase input terminal 212P of the potential measuring section 212 to each other for on/off changeover operation. The negative phase switch SW00N connects the terminal Vin0 connected to the negative terminal side of the rechargeable battery cell C201 and the negative phase input terminal 212N of the potential measuring section 212 to each other for on/off changeover operation.

Further, each of the positive phase switches SW01P to SW18P connects a terminal connected to the positive terminal side of a corresponding one of the rechargeable battery cells C201 to C218, that is, to one of the terminals Vin2 to Vin18, and the positive phase input terminal 212P of the potential measuring section 212 to each other for on/off changeover operation. Meanwhile, each of the negative phase switches SW01N to SW18N connects a terminal connected to the positive terminal side of a corresponding one of the rechargeable battery cells C201 to C218, that is, to one of the terminals Vin2 to Vin18, and the negative phase input terminal 212N of the potential measuring section 212 to each other for on/off changeover operation.

The measuring cell selection section 211 selects a pair of positive and negative switches based on selection signals Sel, xSel and Msel inputted thereto from the control section 213 and controls the switches so that they alternately assume a conducting state and a non-conducting state.

In particular, if a selection signal for selecting the voltage output of the rechargeable battery cell C201 is inputted from the control section 213, then the measuring cell selection section 211 controls the switches other than the selected positive phase switch SW01P and negative phase switch SW01N to a non-conducting state and controls the positive phase switch SW01P and negative phase switch SW01N connected to the terminal Vin1 to alternately assume a conducting state and a non-conducting state. At this time, if the positive phase switch SW01P is controlled to a conducting state, then the negative phase switch SW01N is controlled to a non-conducting state, but if the positive phase switch SW01P is controlled to a non-conducting state, then the negative phase switch SW01N is controlled to a conducting state.

For example, if a selection signal for selecting the voltage output of the rechargeable battery cell C201 is inputted from the control section 213, then the measuring cell selection section 211 changes over the positive phase switch SW00P and negative phase switch SW00N in pair alternately between on and off and changes over the positive phase switch SW01P and the negative phase switch SW01N alternately to on and off in a period reverse to the period in which the positive phase switch SW00P and the negative phase switch SW00N are changed over. At this time, the switches other than the positive phase switches SW00P and SW01P and negative phase switches SW00N and SW01N are controlled to an off state. Through the control, the potential measuring section 212 can measure the battery remaining capacity of the rechargeable battery cell C201.

More particularly, the positive phase switches are controlled by a combination of the positive phase selection signal Sel and the main selection signal Msel, and the negative phase switches are controlled by a combination of the negative phase selection signal xSel and main selection signal Msel.

In the particular example of FIG. 14, when both of the positive phase selection signal Sel00 and the main selection signal Msel00 have the high level, the positive phase switch SW00P is turned on. However, if at least one of the positive phase selection signal Sel00 and the main selection signal Msel00 has the low level, then the positive phase switch SW00P is turned off. On the other hand, when both of the negative phase selection signal xSel00 and the main selection signal Msel00 have the high level, the negative phase switch SW00N is turned on, but if at least one of the negative phase selection signal xSel00 and the main selection signal Msel00 has the low level, then the negative phase switch SW00N is turned off.

Also each of the other positive phase switches SW01P to SW18P is controlled similarly to the positive phase switch SW00P by a combination of corresponding ones of the positive phase selection signals Sel01 to Sel18 and the main selection signals Msel01 to Msel18, and also each of the negative phase switches SW01N to SW18N is controlled similarly to the negative phase switch SW00N by a combination of corresponding ones of the negative phase selection signals xSel01 to xSel18 and the main selection signals Msel01 to Msel18.

Further, in the particular example shown in FIG. 14, the positive phase selection signal Sel00 reverses the level thereof between the high level and the low level after every unit period of time such as, for example, 1 μs. Meanwhile, the negative phase selection signal xSel00 reverses the level thereof between the high level and the low level after every unit period of time such that the reversal between the high level and the low level may be carried out in the opposite direction to that of the reversal of the positive phase selection signal Sel00.

Further, the positive phase selection signal Sel01 reverses the level thereof between the high level and the low level after every unit period of time such that the reversal between the high level and the low level may be carried out in the opposite direction to that of the reversal of the positive phase selection signal Sel00. Meanwhile, the negative phase selection signal xSel01 reverses the level thereof between the high level and the low level after every unit period of time such that the reversal between the high level and the low level may be carried out in the opposite direction to that of the reversal of the positive phase selection signal Sel01.

Accordingly, for example, in order to acquire the battery remaining capacity of the rechargeable battery cell C201, a first state in which the positive phase switch SW00P is turned on and the negative phase switch SW00N is turned off while the positive phase switch SW01P is turned off and the negative phase switch SW01N is turned on and a second state in which the positive phase switch SW00P is turned off and the negative phase switch SW00N is turned on while the positive phase switch SW01P is turned on and the negative phase switch SW01N is turned off are repeated after every unit period of time. Consequently, in the first state, the potential at the terminal Vin0 is inputted to the positive phase input terminal 212P and the potential at the terminal Vin1 is inputted to the negative phase input terminal 212N. In the second state, the potential at the terminal Vin1 is inputted to the positive phase input terminal 212P and the potential at the terminal Vin0 is inputted to the negative phase input terminal 212N.

By the control described above, the difference between the voltage inputted to the positive phase input terminal 212P of the potential measuring section 212 and the voltage inputted to the negative phase input terminal 212N of the potential measuring section 212 becomes equal to the battery remaining capacity of the rechargeable battery cell C201. In other words, the potential measuring section 212 can detect the battery remaining capacity of the selected rechargeable battery cell by measuring the voltage difference between the positive phase input terminal 212P and the negative phase input terminal 212N.

By carrying out such measurement as described above successively for the rechargeable battery cells C201 to C218, the potential measuring section 212 can acquire the negative terminal side voltage of the rechargeable battery cell C201 and the positive terminal side voltages of the rechargeable battery cells C201 to C218 to measure the voltage of the rechargeable battery cells. It is to be noted that, in the example described above, the voltage of a single rechargeable battery cell is measured by selecting a positive phase switch and a negative phase switch positioned adjacent each other. However, also it is possible to collectively measure the voltage of a plurality of rechargeable battery cells connected in series by selecting a positive phase switch and a negative phase switch which are not positioned adjacent each other.

The potential measuring section 212 includes an analog to digital converter (ADC) for converting an analog voltage of a rechargeable battery cell inputted thereto into a digital voltage signal. The control section 213 carries out a signal process for the voltage signal outputted from the potential measuring section 212 and outputs a resulting signal to a charging monitoring controlling section not shown. The charging monitoring controlling section controls a power supply apparatus to supply power to a rechargeable battery cell which is in an insufficiently charged state based on measured charged states of the rechargeable battery cells so that the rechargeable battery cells may be charged without dispersion. The potential measuring section 212 and the control section 213 are low breakdown voltage circuits configured, for example, from a MOS transistor or the like.

Upon the positive phase switches SW00P to SW18P and the negative phase switches SW00N to SW18N used in the rechargeable battery module 20 described above, a maximum voltage of the rechargeable battery cell unit 22 may possibly act depending upon the order or the timing of switching. The present technology proposes a switch which implements reduction of the gate-source voltage Vgs while a positive phase switch and a negative phase switch are configured from a low breakdown voltage device and which turns on/off the connection between the terminals Vin0 to Vin18 on the rechargeable battery cell side and the positive phase input terminal 212P and the negative phase input terminal 212N of the potential measuring section 212 side while reverse flow in a high voltage state is prevented.

It is to be noted that, since there is the possibility that a maximum voltage of the rechargeable battery cell unit 22 may act between the terminals of the rechargeable battery cell side and the terminals of the potential measuring section side, the drain-source voltage Vds requires a high breakdown voltage device configuration.

B-1. Fourth Configuration Form of the High Breakdown Voltage Switch

Figure 15:
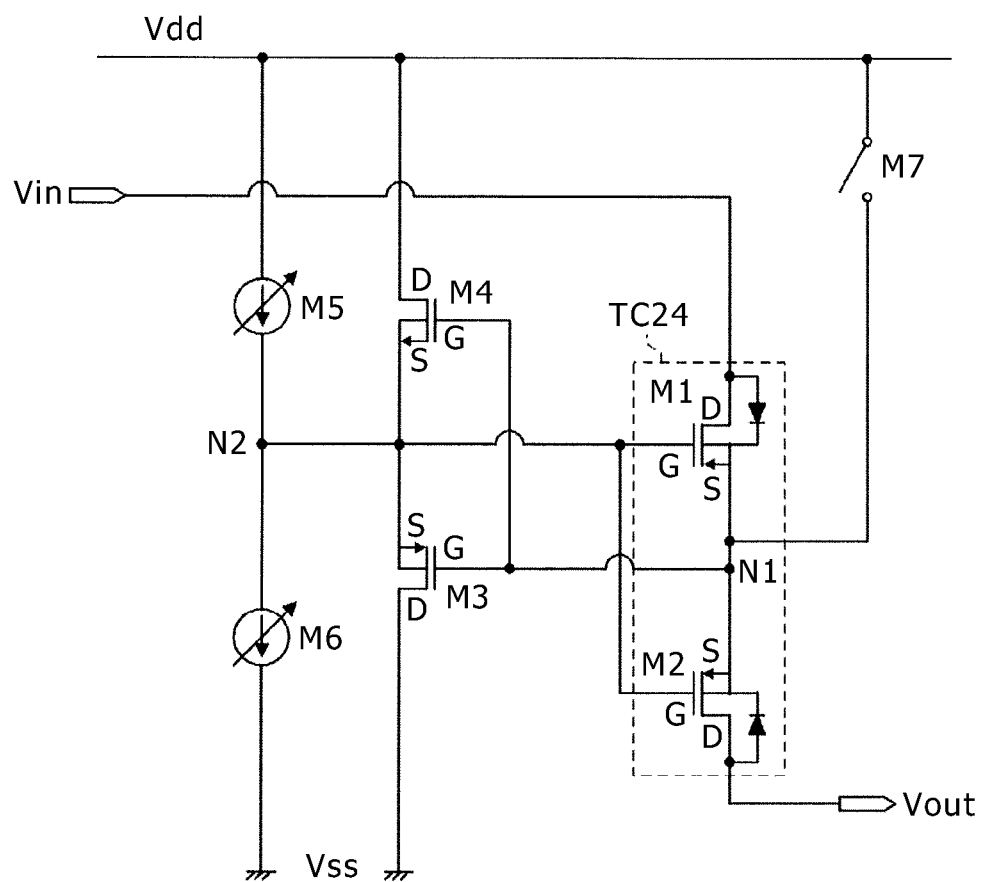
FIG. 15 is a circuit diagram showing a basic configuration of a high breakdown voltage switch according to a fourth configuration form.

FIG. 15 shows a basic configuration of a high breakdown voltage switch S4 according to a fourth configuration form. Referring to FIG. 15, the high breakdown voltage switch S4 shown is formed using a MOS transistor having a P-type channel structure. It is to be noted that a P-type MOS transistor is hereinafter referred to as "pMOS" and an N-type MOS transistor is hereinafter referred to as "nMOS."

The high breakdown voltage switch S4 includes a second transistor circuit TC24 including two pMOSs M1 and M2 which configure a first PMOS transistor and a second PMOS transistor, respectively, a pMOS M3 which configures a third PMOS transistor, an nMOS M4 which configures a fourth NMOS transistor, a current source M5, another current source M6 and a switch circuit M7.

In the second transistor circuit TC24, an input terminal Vin and an output terminal Vout are connected to each other through the pMOS M1 and the pMOS M2 connected in series. In particular, the pMOS M1 and the pMOS M2 are connected at the source terminals thereof to each other at a connection point N1, and the pMOS M1 is connected at the drain terminal thereof to the input terminal Vin and the pMOS M2 is connected at the drain terminal thereof to the output terminal Vout.

The second transistor circuit TC24 configures a high breakdown voltage switch which opens and closes the connection between the input terminal Vin and the output terminal Vout. In particular, when both of the pMOS M1 and the pMOS M2 are turned on, the input terminal Vin and the output terminal Vout are placed into a connected state therebetween. However, when at least one of the pMOS M1 and the pMOS M2 is turned off, the input terminal Vin and the output terminal Vout are placed into a disconnected state therebetween.

The pMOS M3 is connected at the gate terminal thereof to the connection point N1, at the source terminal thereof to the gate terminal of the pMOS M1 and the gate terminal of the pMOS M2, and at the drain terminal thereof to a fixed voltage source Vss which is, for example, the ground potential. Further, an output terminal of the current source M5 is connected to the source terminal of the pMOS M3. The input terminal of the current source M5 is connected to the fixed voltage source Vdd (Vss<Vdd). It is to be noted that the fixed voltage source Vdd is set higher than a voltage which is inputted from the input terminal Vin or the output terminal Vout to the connection point N1. Further, the fixed voltage sources Vdd and Vss have a low impedance.

Consequently, if the pMOS M3 is turned on and a voltage Vgs3 is generated between the gate and the source of the pMOS M3 (gate potential<source potential), then the voltage Vgs3 is applied also between the connection point N1 and the gate terminals of the pMOSs M1 and M2. At this time, since the pMOSs M1 and M2 are turned off, the high breakdown voltage switch S4 places the input terminal Vin and the output terminal Vout into a connected state therebetween.

Meanwhile, the nMOS M4 is connected at the gate terminal thereof to the connection point N1, at the source terminal thereof to the gate terminal of the pMOS M1 and the gate terminal of the pMOS M2, and at the drain terminal thereof to the fixed voltage source Vdd. Further, an input terminal of the current source M6 is connected to the source terminal of the nMOS M4. An output terminal of the current source M6 is connected to the fixed voltage source Vss.

Consequently, if the nMOS M4 is turned on and a voltage Vgs4 is generated between the gate and the source of the nMOS M4 (gate potential>source potential), then the voltage Vgs4 is applied also between the connection point N1 and the gate terminals of the pMOSs M1 and M2. This voltage Vgs4 is adjusted to a level with which the pMOSs M1 and M2 can be turned on as hereinafter described. Accordingly, if the voltage Vgs4 is applied also between the connection point N1 and the gate terminals of the pMOSs M1 and M2, then the pMOSs M1 and M2 are turned on and the high breakdown voltage switch S4 places the input terminal Vin and the output terminal Vout into a connected state therebetween.

The switch circuit M7 connects the fixed voltage source Vdd and the connection point N1 to each other and configures a switch for opening and closing the connection between the fixed voltage source Vdd and the connection point N1. Here, if the switch circuit M7 is turned on, then the potential at the connection point N1 becomes equal to the potential of the fixed voltage source Vdd. On the contrary, if the switch circuit M7 is turned off, then the potential at the connection point N1 becomes equal to a higher one of the potentials at the input terminal Vin and the output terminal Vout transmitted through the parasitic diodes of the pMOSs M1 and M2. In the present configuration form, the input terminal Vin has a higher potential, and consequently, when the switch circuit M7 is turned off, the potential at the connection point N1 becomes equal to that at the input terminal Vin.

Now, an example of particular operation of the high breakdown voltage switch S4 described above is described. In the present fourth configuration form, by controlling the current sources M5 and M6 and the switch circuit M7 of the high breakdown voltage switch S4 between on and off, a conducting state of the high breakdown voltage switch S4, a first non-conducting state of the high breakdown voltage switch S4 and a second non-conducting state of the high breakdown voltage switch S4 can be implemented. It is to be noted that, in the high breakdown voltage switch S4, changeover between the conducting state and the first non-conducting state can be implemented at a higher speed than that of changeover between the conducting state and the second non-conducting state.

Figure 16:
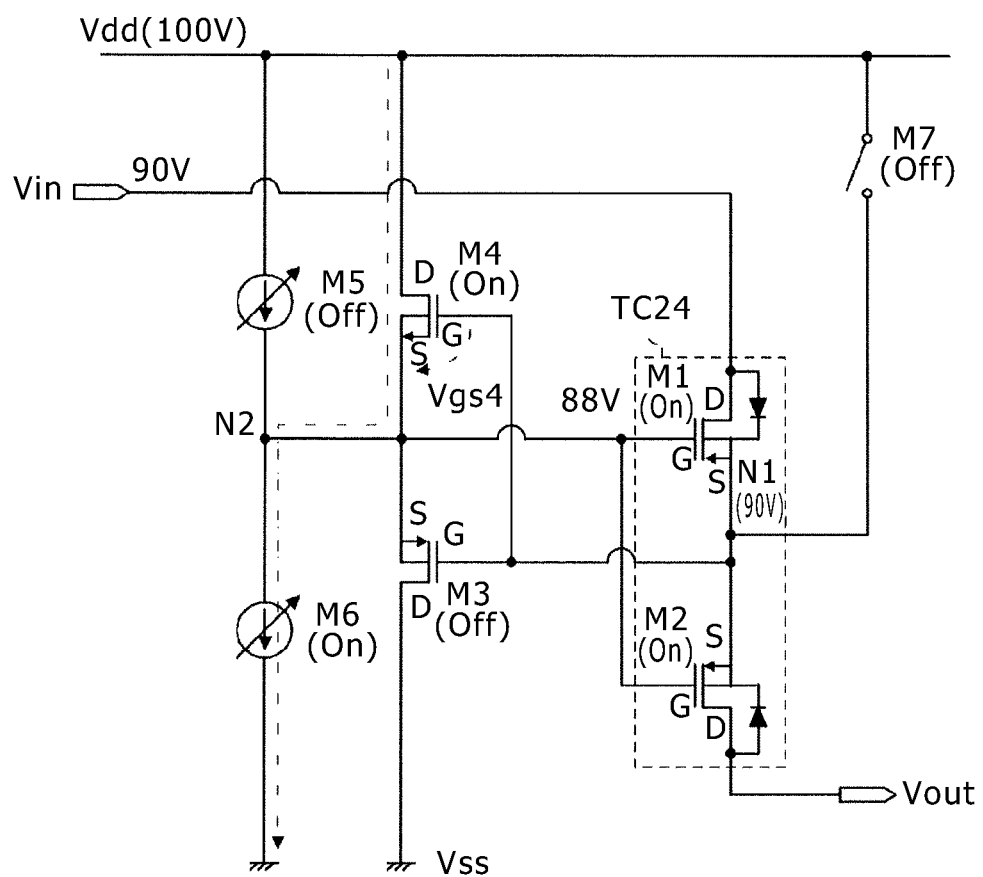
FIG. 16 is a circuit diagram illustrating a conducting state of the high breakdown voltage switch of FIG. 15.
Figure 17:
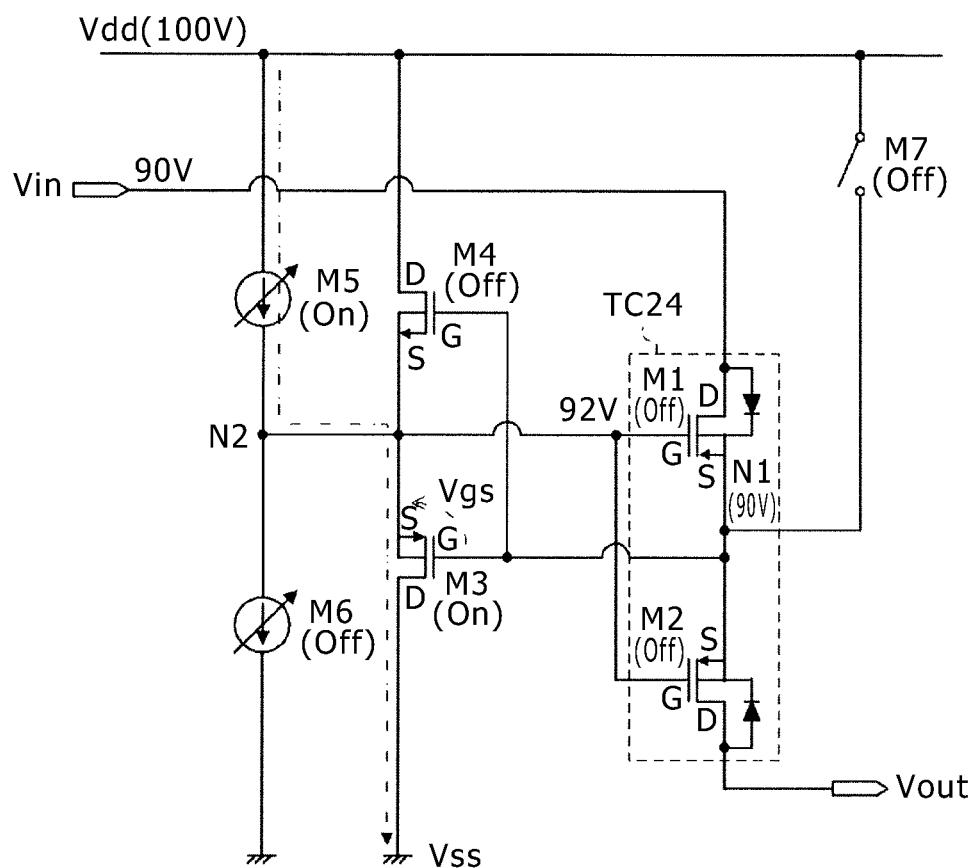
FIG. 17 is a circuit diagram illustrating a first non-conducting state of the high breakdown voltage switch of FIG. 15.
Figure 18:
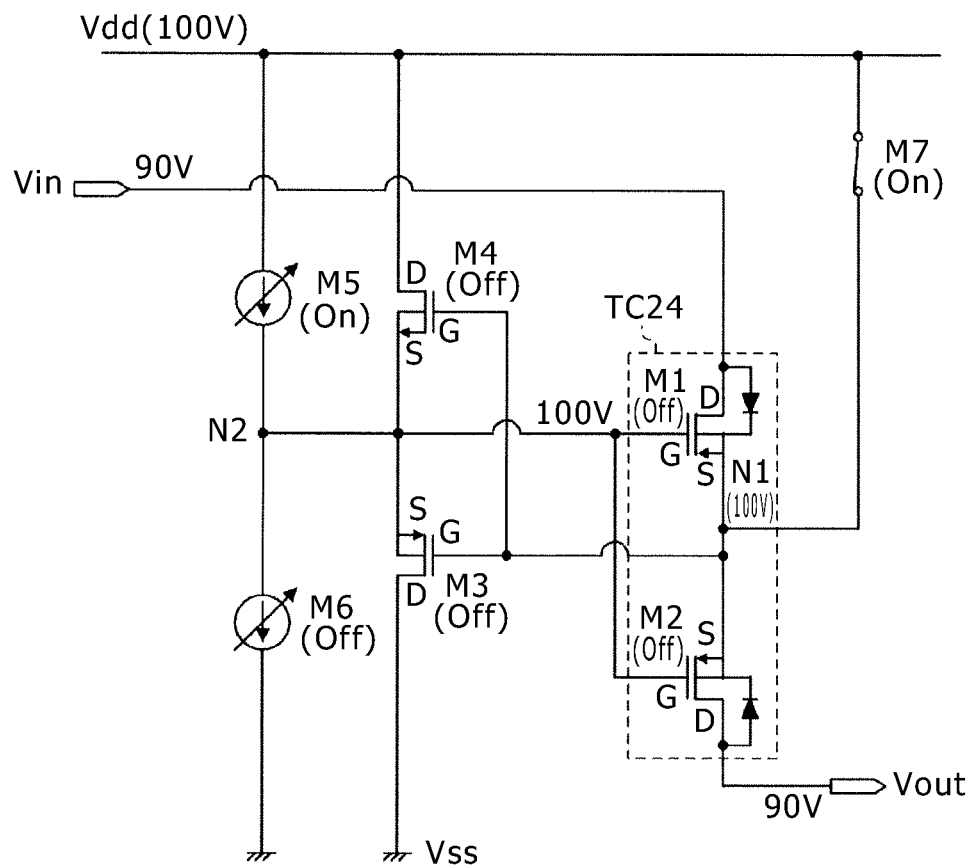
FIG. 18 is a circuit diagram illustrating a second non-conducting state of the high breakdown voltage switch of FIG. 15.

FIG. 16 illustrates the conducting state of the high breakdown voltage switch S4, and FIG. 17 illustrates the first non-conducting state of the high breakdown voltage switch S4 while FIG. 18 illustrates the second non-conducting state of the high breakdown voltage switch S4. It is to be noted that, while, in FIGS. 16 to 18, voltages at several points are described, they illustrate an example of operation and the present technology is not limited to the described voltages.

Referring first to FIG. 16, the current source M5 is controlled to an off state and the current source M6 is controlled to an on state while the switch circuit M7 is controlled to an off state. At this time, a voltage of 90 V at the input terminal Vin is supplied to the connection point N1 through the parasitic diode of the pMOS M1.

Meanwhile, the nMOS M4 and the current source M6 configure a source follower circuit, and the pMOS M3 is off. Accordingly, a voltage of, for example, 88 V which is obtained by lowering 90 V, which is the voltage at the connection point N1, by the voltage Vgs4 corresponding to a forward voltage drop of the nMOS M4. Consequently, the pMOSs M1 and M2 are turned on to place the input terminal Vin and the output terminal Vout into a connected state therebetween.

At this time, even if the voltage at the input terminal Vin is as low as, for example, 0 V from such a reason that the battery remaining capacity of a rechargeable battery cell of a measurement object is low or the like, the nMOS M4 can place the input terminal Vin and the output terminal Vout into a connected state therebetween. This is because, in the connected state illustrated in FIG. 16, the nMOS M4 generates the voltage Vgs4 between the gate and the source by a source follower operation thereof irrespective of the voltage at the connection point N1. In other words, the high breakdown voltage switch S4 according to the present configuration form can carry out changeover to the conducting state irrespective of the battery remaining capacity of the rechargeable battery cell.

It is to be noted that the voltage Vgs4 generated by the nMOS M4 exhibits a value corresponding to the size or aspect ratio of the nMOS M4 and the current amount of the current source M6. Since only it is necessary for the voltage Vgs4 to have a level with which the pMOSs M1 and M2 can be turned on as described hereinabove, the size of the nMOS M4 and the current amount of the current source M6 can be determined suitably in response to the on voltage of the pMOSs M1 and M2.

Since the on voltage of the pMOSs M1 and M2 can be adjusted by suitably adjusting the size of the nMOS M4 and the current amount of the current source M6 at a stage of design, the size and the breakdown voltage of the pMOSs M1 and M2 can be selected suitably in accordance with an application of the high breakdown voltage switch. Consequently, the degree of freedom in design of the high breakdown voltage switch S4 is enhanced. For example, when high speed switching is required, it is possible to carry out such adjustment as to design the voltage Vgs4 rather low to decrease the voltage swing amount.

Now, the first non-conducting state of the high breakdown voltage switch S4 is described with reference to FIG. 17. In FIG. 17, the current source M5 is controlled to an on state and the current source M6 is controlled to an off state while the switch circuit M7 is controlled to an off state. At this time, the voltage of 90 V at the input terminal Vin is supplied to the connection point N1 through the parasitic diode of the pMOS M1.

Meanwhile, the pMOS M3 and the current source M5 configure a source follower circuit, and the nMOS M4 is off. Accordingly, a voltage of, for example, 92 V which is obtained by raising 90 V, which is the voltage at the connection point N1, by the voltage Vgs3 corresponding to a forward voltage drop of the pMOS M3 is applied to the source terminal of the pMOS M3. Consequently, the pMOSs M1 and M2 are turned off, and the input terminal Vin and the output terminal Vout are placed into a disconnected state therebetween.

If the conducting state illustrated in FIG. 16 and the first non-conducting state illustrated in FIG. 17 are changed over therebetween, then the potential at the connection point N1 fluctuates in the proximity of the voltage at the input terminal Vin. For example, if the high breakdown voltage switch S4 according to the fourth configuration form is applied to the terminal Vin1 of the rechargeable battery module 20 according to the second embodiment described hereinabove, then the voltage at the connection point N1 is not the potential of the terminal Vin1, that is, the highest potential, but a voltage between the voltage at the terminal Vin0 and the voltage at the terminal Vin1 and fluctuates around a potential in the proximity of the potential at the terminal Vin1, that is, of the highest potential.

This is because, after the potential at the connection point N1 rises to the highest potential of the input terminal Vin once, even if the voltage at the input terminal Vin drops, the potential at the connection point N1 does not fluctuate fully following up the voltage but moves up and down in accordance with the fluctuation of the voltage at the input terminal Vin in the proximity of the highest potential of the voltage fluctuation range at the input terminal Vin by an action of the parasitic diode of the pMOSs M1 and M2. In short, since the fluctuation amount of the voltage at each node of the high breakdown voltage switch S4 including the connection point N1 becomes comparatively small, the high breakdown voltage switch S4 can achieve high speed switching.

However, in the high breakdown voltage switch S4 in the first non-conducting state illustrated in FIG. 17, since current is supplied steadily from the current source M5, the high breakdown voltage switch S4 consumes power while it is in the non-conducting state. Therefore, in the high breakdown voltage switch S4 according to the fourth configuration form, the first non-conducting state illustrated in FIG. 17 and the second non-conducting state hereinafter described with reference to FIG. 18 are suitably selectively used to achieve both of reduction in power consumption and implementation of high speed operation.

In the second non-conducting state of the high breakdown voltage switch S4 illustrated in FIG. 18, the current source M5 is controlled to an on state and the current source M6 is controlled to an off state while the switch circuit M7 is controlled to an on state. At this time, a voltage of 100 V of the fixed voltage source Vdd is supplied to the connection point N1 through the switch circuit M7.

At this time, since the gate voltage of the pMOS M3 is higher than the voltage inputted from the fixed voltage source Vdd to the input terminal Vin, it exhibits the highest potential in the high breakdown voltage switch S4. Consequently, the pMOS M3 is turned off. Further, although the current source M5 is controlled to an on state, since the current source M6 and the pMOS M3 are off, the current source M5 continues to supply current until the highest potential with which the potential at a connection point N2 of the current sources M5 and M6 can be raised is reached. As a result, also the current source M5 is placed into a state similar to an off state.

In other words, all of the pMOS M3, nMOS M4 and current sources M5 and M6 are placed into an off state. At this time, since all transistors are off, the high breakdown voltage switch S4 in the second non-conducting state illustrated in FIG. 18 does not supply the steady current and hence is in a state in which the power consumption is low. It is to be noted that, although the nMOS M4 may be temporarily placed into an on state in a transition state in which the potential at the connection point N2 becomes equal to that of the fixed voltage source Vdd, if the nMOS M4 is placed into an on state, then the fixed voltage source Vdd and the connection point N2 are connected to each other. Therefore, there is no particular problem.

However, since the potential at the connection point N1 is 100 V which is the highest potential in the high breakdown voltage switch S4, in order to change the high breakdown voltage switch S4 from the second non-conducting state into the conducting state, it is necessary to wait that the potential at the connection point N1 drops to a potential which is inputted subsequently from the input terminal Vin. For example, if the potential to be inputted subsequently from the input terminal Vin is the potential at the terminal Vin18 which outputs the lowest potential from among the rechargeable battery cells shown in FIG. 13, then a period of time until the potential at the connection point N1 drops from the highest potential to the lowest potential in the high breakdown voltage switch S4 is required, which is not suitable for high speed switching.

Accordingly, when a high speed switching operation is required, switching between the conducting state illustrated in FIG. 16 and the first non-conducting state illustrated in FIG. 17 is carried out to implement high speed switching. However, when a high speed switching operation is not required, switching between the conducting state illustrated in FIG. 16 and the second non-conducting state illustrated in FIG. 18 is carried out to implement switching operation not at a high speed. By selectively applying the two switching operations in this manner, both of low power consumption and high speed switching can be satisfied.

B-2. Fifth Configuration Form of the High Breakdown Voltage Switch

Figure 19:
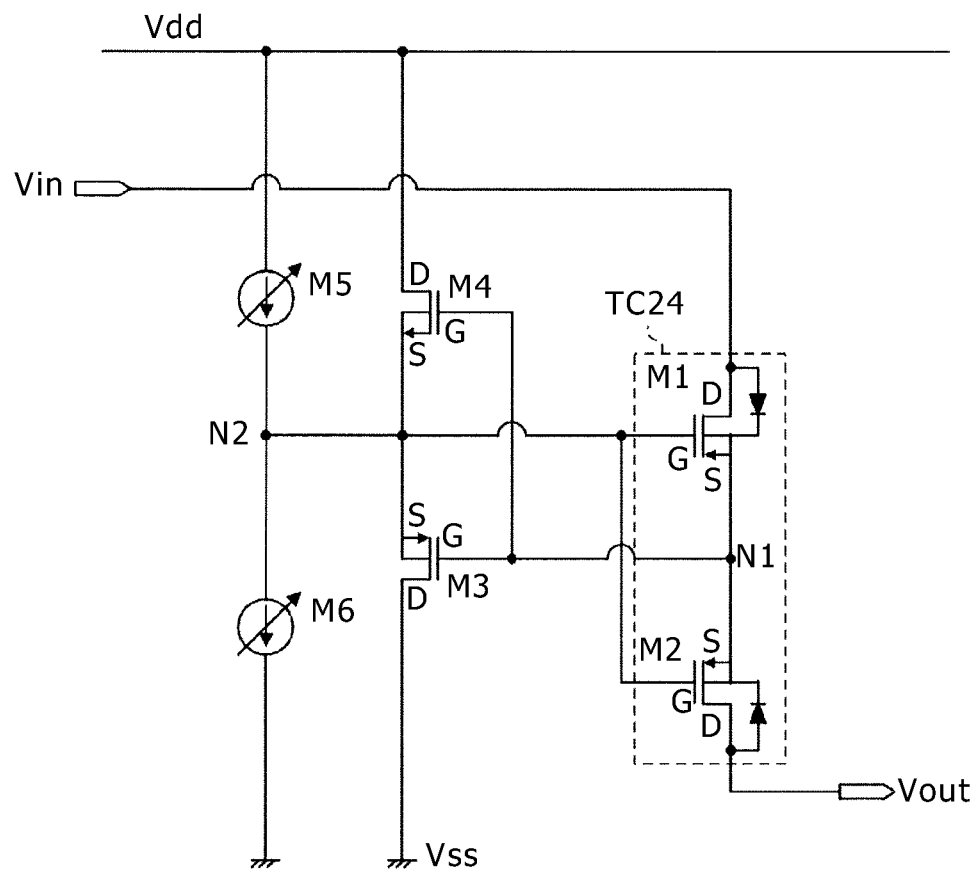
FIG. 19 is a circuit diagram showing a basic configuration of a high breakdown voltage switch according to a fifth configuration form.

FIG. 19 shows a basic configuration of a high breakdown voltage switch S5 according to a fifth configuration form. The high breakdown voltage switch S5 shown in FIG. 19 is configured such that it does not include the switch circuit M7 while the high breakdown voltage switch S4 of the fourth configuration form includes the switch circuit M7.

The high breakdown voltage switch S5 can implement the conducting state and the first non-conducting state from among the states implemented by the high breakdown voltage switch S4 described above. Consequently, the high breakdown voltage switch S5 is simplified in circuit configuration in comparison with the high breakdown voltage switch S4 of the fourth configuration form described hereinabove and the circuit area can be reduced.

B-3. Sixth Configuration Form of the High Breakdown Voltage Switch

Figure 20:
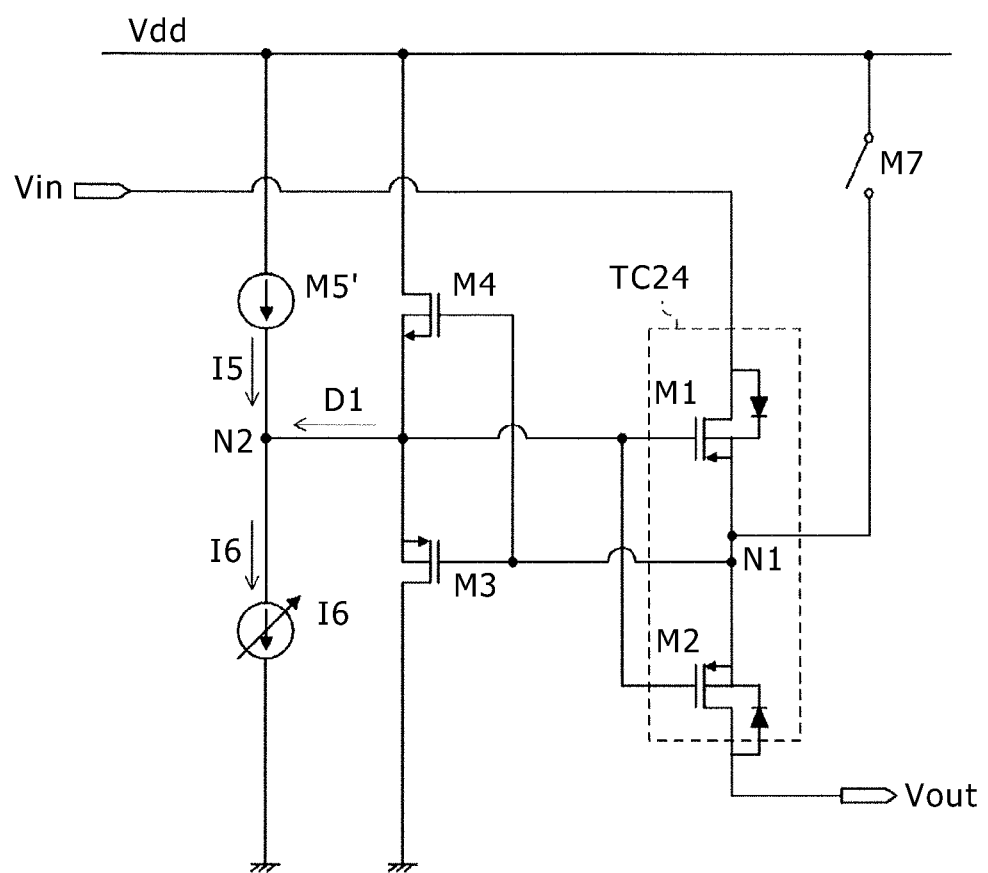
FIG. 20 is a circuit diagram showing a basic configuration of a high breakdown voltage switch according to a sixth configuration form.

FIG. 20 shows a basic configuration of a high breakdown voltage switch S6 according to a sixth configuration form. The high breakdown voltage switch S6 shown in FIG. 20 is different from the high breakdown voltage switch S4 according to the fourth configuration form described hereinabove in that it includes a current source M5' in place of the current source M5 provided in the high breakdown voltage switch S4. The current source M5' is different from the current source M5 in that, while on/off changeover control is possible with the current source M5, the current source M5' does not include a function for such on/off changeover control.

In the high breakdown voltage switch S6 shown in FIG. 20, when the current source M6 is on, current flows through both of the current source M5' and the current source M6. Since current I5 generated by the current source M5 is set lower than current I6 generated by the current source M6 (I6>I5), at the connection point N2 shown in FIG. 20, current flows in the direction indicated by an arrow mark D1. Consequently, the current source M6 and the nMOS M4 operate as a source follower and the pMOS M3 turns off, and consequently, the second transistor circuit TC24 is placed into a conducting state.

On the other hand, when the current source M6 is off, since the current source M5' and the pMOS M3 operate as a source follower, the second transistor circuit TC24 is placed into a non-conducting state similarly as in the fourth configuration form described hereinabove.

In this manner, with the high breakdown voltage switch S6 according to the sixth configuration form, although power consumption increases a little, since the necessity for the control relating to the current source M5 is eliminated, the number of controlling signal lines can be reduced. Therefore, the circuit area relating to the high breakdown voltage switch S6 can be reduced.

B-4. Seventh Configuration Form of the High Breakdown Voltage Switch

Figure 21:
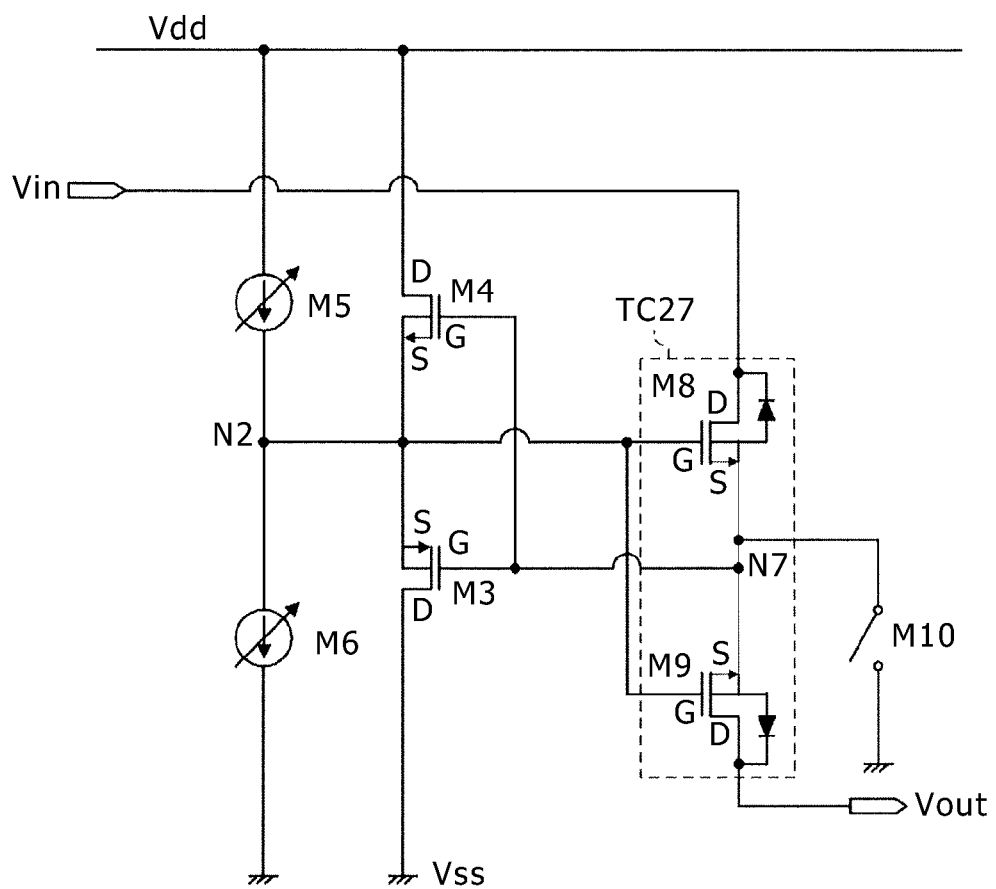
FIG. 21 is a circuit diagram showing a basic configuration of a high breakdown voltage switch according to a seventh configuration form.

FIG. 21 shows a basic configuration of a high breakdown voltage switch S7 according to a seventh configuration form. The high breakdown voltage switch S7 shown in FIG. 21 is different from the high breakdown voltage switch S4 according to the fourth configuration form described hereinabove in that it includes a second transistor circuit TC27 in place of the second transistor circuit TC24 provided in the high breakdown voltage switch S4.

Referring to FIG. 21, the second transistor circuit TC27 includes two N-type MOS transistors M8 and M9 which configure a fifth NMOS transistor circuit and a sixth NMOS transistor circuit, respectively. The N-type MOS transistors M8 and M9 are hereinafter referred to as nMOS M8 and nMOS M9, respectively. It is to be noted that, in the present seventh configuration form, the pMOS M3 configures a seventh PMOS transistor and the nMOS M4 configures an eighth NMOS transistor.

In the second transistor circuit TC27, the input terminal Vin and the output terminal Vout are connected to each other by the nMOS M8 and the nMOS M9 connected in series. The nMOS M8 and the nMOS M9 are connected to each other at the source terminals thereof at a connection point N7, and the nMOS M8 is connected at the drain terminal thereof to the input terminal Vin while the nMOS M9 is connected at the drain terminal thereof to the output terminal Vout.

Consequently, the second transistor circuit TC27 implements the switch function which places the input terminal Vin and the output terminal Vout into a connected state therebetween when both of the nMOS M8 and the nMOS M9 are turned on, but places, when at least one of the nMOS M8 and the nMOS M9 is turned off, the input terminal Vin and the output terminal Vout into a disconnected state therebetween.

A switch circuit M10 connects the fixed voltage source Vss and the connection point N7 to each other and configures a switch which opens and closes the connection between the fixed voltage source Vss and the connection point N7. Here, if the switch circuit M10 is turned on, then the potential at the connection point N7 becomes equal to that of the fixed voltage source Vss such as, for example, the ground potential. On the other hand, if the switch circuit M10 is turned off, then the potential at the connection point N7 becomes a lower one of the potentials at the input terminal Vin and the output terminal Vout transmitted through the parasitic diodes of the nMOSs M8 and M9, respectively.

The pMOS M3 is connected at the gate terminal thereof to the connection point N7, at the source terminal thereof to the gate terminal of the nMOS M8 and the gate terminal of the nMOS M9 and at the drain terminal thereof to the fixed voltage source Vss. Further, an output terminal of the current source M5 is connected to the soured terminal of the pMOS M3. The input terminal of the current source M5 is connected to the fixed voltage source Vdd (Vss<Vdd).

Consequently, if the pMOS M3 is turned on and a voltage Vgs3 is generated between the gate and the source of the pMOS M3 (gate potential<source potential), then the voltage Vgs3 is applied also between the connection point N7 and the gate terminals of the nMOSs M8 and M9. Since this voltage Vgs3 is adjusted so that a voltage with which the nMOSs M8 and M9 can be turned on is obtained, the nMOSs M8 and M9 are turned on. Consequently, in the high breakdown voltage switch S7, the input terminal Vin and the output terminal Vout are placed into a connected state therebetween.

The nMOS M4 is connected at the gate terminal thereof to the connection point N7, at the source terminal thereof to the gate terminal of the nMOS M8 and the gate terminal of the nMOS M9, and at the drain terminal thereof to the fixed voltage source Vdd. Further, the input terminal of the current source M6 is connected to the source terminal of the nMOS M4. The output terminal of the current source M6 is connected to the fixed voltage source Vss.

Consequently, if the nMOS M4 is turned on and a voltage Vgs4 is generated between the gate and the source of the nMOS M4 (gate potential>source potential), then the voltage Vgs4 is applied also between the connection point N7 and the gate terminals of the nMOSs M8 and M9. Accordingly, since the nMOSs M8 and M9 are turned off, the high breakdown voltage switch S7 places the input terminal Vin and the output terminal Vout into a disconnected state therebetween.

The switch circuit M10 connects the fixed voltage source Vss and the connection point N7 to each other. Consequently, if the switch circuit M10 is controlled to the connection state, then the potential at the connection point N7 becomes equal to the potential of the fixed voltage source Vss, for example, to the ground potential. However, if the switch circuit M10 is controlled to a non-connection state, the potential at the connection point N7 becomes equal to the potential at one of the input terminal Vin and the output terminal Vout transmitted through the parasitic diodes of the nMOSs M8 and M9.

An example of operation of the high breakdown voltage switch S7 described above is described. In the seventh configuration form, the conducting state of the high breakdown voltage switch S7, the first non-conducting state of the high breakdown voltage switch S7 and the second non-conducting state of the high breakdown voltage switch S7 can be implemented by controlling on/off of the current sources M5 and M6 and the switch circuit M10 of the high breakdown voltage switch S7. It is to be noted that, in the high breakdown voltage switch S7, changeover between the conducting state and the first non-conducting state can be implemented at a high speed in comparison with changeover between the conducting state and the second non-conducting state.

Figure 22:
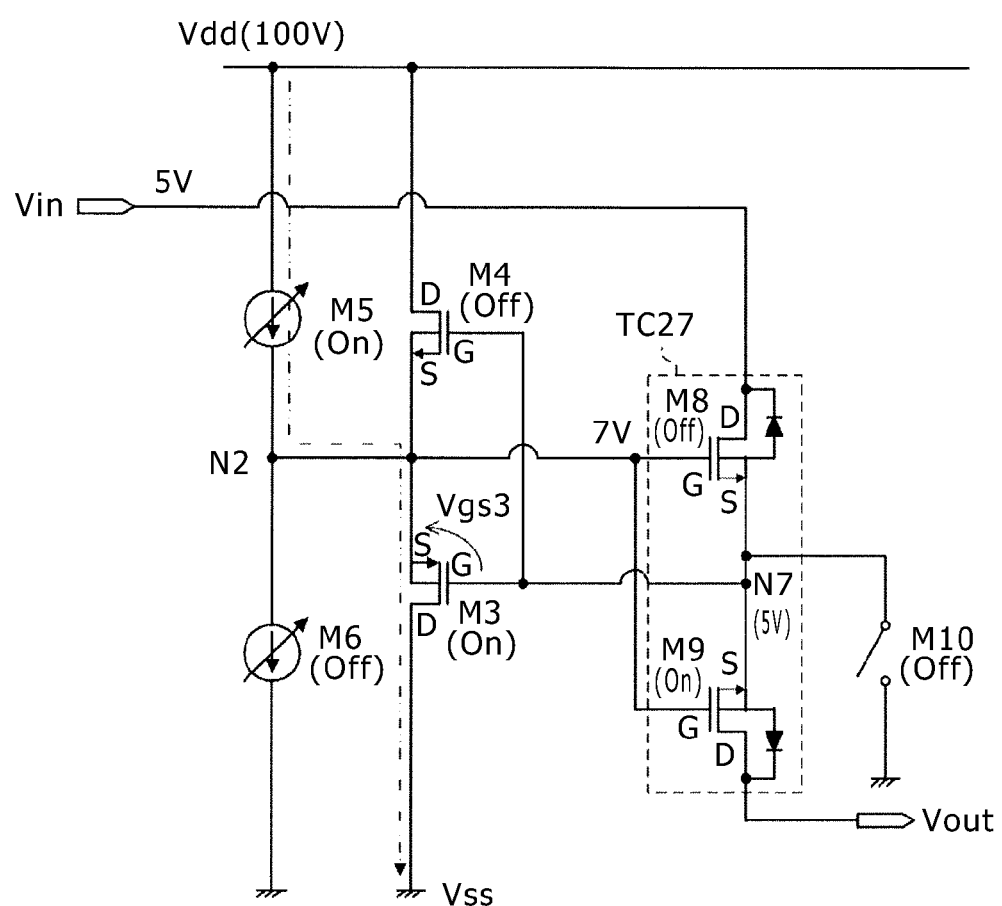
FIG. 22 is a circuit diagram illustrating a conducting state of the high breakdown voltage switch of FIG. 21.
Figure 23:
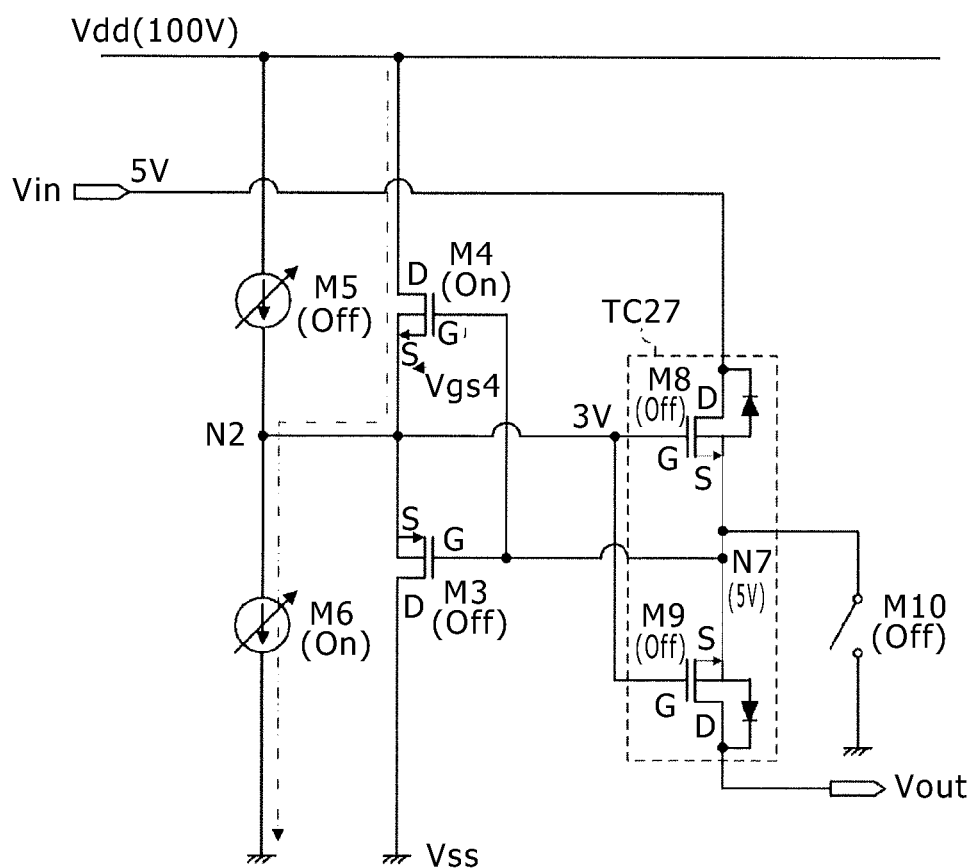
FIG. 23 is a circuit diagram illustrating a first non-conducting state of the high breakdown voltage switch of FIG. 21.
Figure 24:
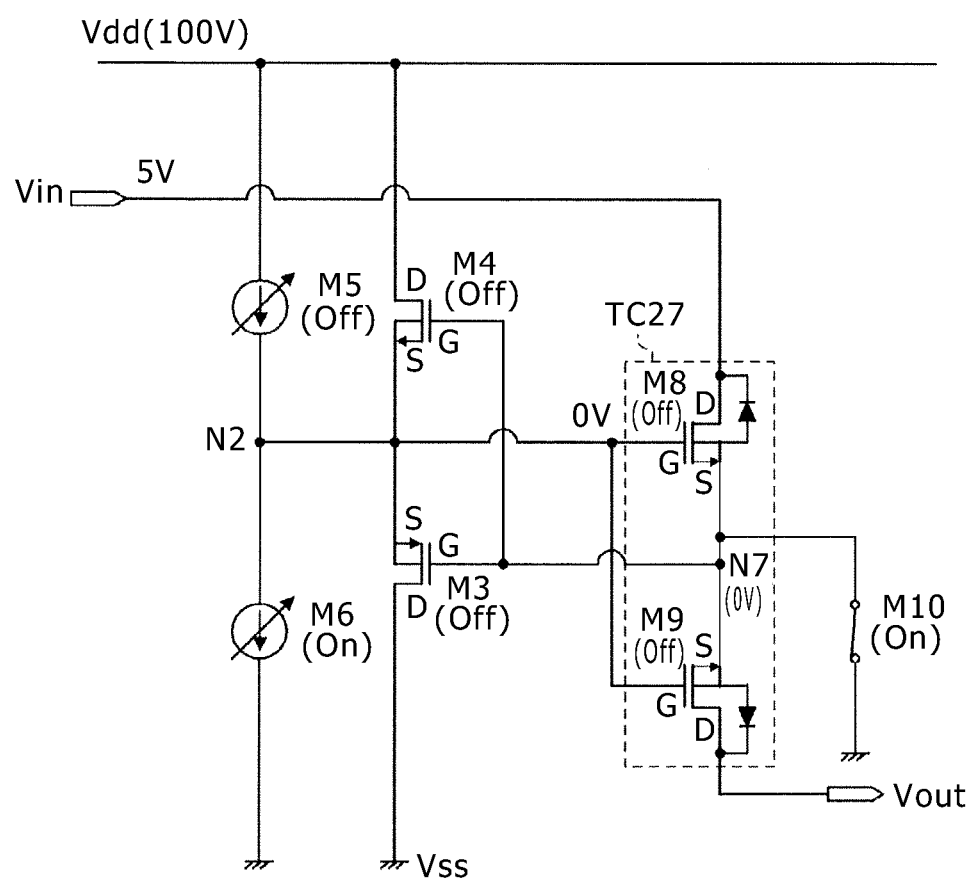
FIG. 24 is a circuit diagram illustrating a second non-conducting state of the high breakdown voltage switch of FIG. 21.

In the following, the conducting state, first non-conducting state and second non-conducting state of the high breakdown voltage switch S7 are described with reference to FIGS. 22 to 24. FIG. 22 illustrates the conducting state of the high breakdown voltage switch S7; FIG. 23 illustrates the first non-conducting state of the high breakdown voltage switch S7; and FIG. 24 illustrates the second non-conducting state of the high breakdown voltage switch S7. It is to be noted that, although voltages indicated at several points are described in FIGS. 22 to 32, they indicate an example of operation and the present technology is not limited to the described voltages.

In FIG. 22, the current source M5 is controlled to an on state and the current source M6 is controlled to an on state while the switch circuit M10 is controlled to an off state. At this time, a lower one of the input terminal Vin and the output terminal Vout is supplied to the connection point N7 through the parasitic diode of one of the nMOSs M8 and M9.

At this time, the pMOS M3 and the current source M5 operate as a source follower, and the nMOS M4 is off. Further, for example, if it is assumed that the voltage at the connection point N7 is 5 V, then a voltage obtained by raising the voltage at the connection point N7 by a voltage Vgs3 corresponding to a voltage drop in the forward direction, for example, a voltage of 7 V, is applied to the source terminal of the pMOS M3. Consequently, the nMOSs M8 and M9 are turned on, and the input terminal Vin and the output terminal Vout are placed into a connected state therebetween.

Further, even if the potential difference between the input terminal Vin and the output terminal Vout reduces to 0 V because the remaining capacity of the rechargeable battery cell is low, in order to generate the voltage Vgs3 between the gate and the source irrespective of the voltage at the connection point N7, the pMOS M3 places the input terminal Vin and the output terminal Vout into a connected state therebetween. In other words, irrespective of the potential difference between the input terminal Vin and the output terminal Vout, the high breakdown voltage switch S7 according to the present configuration form can change over the input terminal Vin and the output terminal Vout to the connected state therebetween by the control of the current sources M5 and M6 and the switch circuit M10.

It is to be noted that the voltage Vgs3 generated by the pMOS M3 comes to have a value corresponding to the size or the aspect ratio of the pMOS M3 and the current amount of the current source M6 similarly as in the case of the fourth configuration form described hereinabove. Since the voltage Vgs3 can be adjusted in this manner at the stage of design, the degree of freedom in design is enhanced and the voltage Vgs3 can be selected in accordance with an application. For example, in the case where high speed switching is required, the voltage Vgs3 is designed so as to be comparatively low so that such adjustment as to decrease the voltage swing amount can be carried out.

Now, the first non-conducting state of the high breakdown voltage switch S7 is described with reference to FIG. 23. The current source M5 is controlled to an off state and the current source M6 is controlled to an on state while the switch circuit M10 is controlled to an off state. At this time, a lower one of the voltages at the input terminal Vin and the output terminal Vout is supplied to the connection point N7 through the parasitic diode of one of the nMOSs M8 and M9.

Meanwhile, the nMOS M4 and the current source M6 configure a source follower circuit, and the pMOS M3 is off. Accordingly, to the source terminal of the nMOS M4, a voltage obtained by lowering 5 V, which is a voltage at the connection point N7, by the voltage Vgs4 which corresponds to a voltage drop in the forward direction of the nMOS M4, for example, a voltage of 3 V, is applied. Consequently, the pMOSs M1 and M2 are turned off, and the input terminal Vin and the output terminal Vout are placed into a disconnected state therebetween.

Here, if changeover between the conducting state illustrated in FIG. 22 and the first non-conducting state illustrated in FIG. 23 is carried out, then the potential at the connection point N7 fluctuates in the proximity of a lower one of the voltages at the input terminal Vin and the output terminal Vout. For example, if the high breakdown voltage switch S7 according to the fourth configuration form is applied to the terminals Vin1 and Vin2 of the module upon charging according to the second embodiment described hereinabove, the voltage at the connection point N7 is not the potential of the terminal Vin2, that is, the highest potential, but is one of the voltages at the terminal Vin2 and the terminal Vin1 and fluctuates at a potential in the proximity of the potential at the terminal Vin2, that is, of the highest potential.

This is because, after the potential at the connection point N7 rises to the highest potential of the input terminal Vin once as a result of changeover to the first non-conducting state, even if the voltage at the input terminal Vin drops, the potential at the connection point N7 does not fluctuate fully following up the voltage but moves up and down in accordance with the fluctuation of the voltage at the input terminal Vin in the proximity of the highest potential of the voltage fluctuation range at the input terminal Vin while the potential at the connection point N7 discharges to the output terminal Vout by an action of the parasitic diode of the nMOSs M8 and M9. In short, since the fluctuation amount of the voltage at each node of the high breakdown voltage switch S7 including the connection point N7 becomes comparatively small, the high breakdown voltage switch S7 can achieve high speed switching.

However, in the high breakdown voltage switch S7 in the first non-conducting state illustrated in FIG. 23, since current is supplied steadily from the current source M6, the high breakdown voltage switch S7 consumes power while it is in the non-conducting state. Therefore, in the high breakdown voltage switch S7 according to the seventh configuration form, the first non-conducting state illustrated in FIG. 23 and the second non-conducting state hereinafter described with reference to FIG. 24 are suitably selectively used to achieve both of reduction in power consumption and implementation of high speed operation.

Now, the second non-conducting state of the high breakdown voltage switch S7 is described with reference to FIG. 24. In FIG. 24, the current source M5 is controlled to an off state and the current source M6 is controlled to an on state while the switch circuit M10 is controlled to an on state. At this time, a voltage of the fixed voltage source Vss, for example, the ground potential of 0 V, is supplied to the connection point N7 through the switch circuit M10.

At this time, since the voltage of the fixed voltage source Vss is lower than the voltage inputted from the input terminal Vin, the gate voltage of the nMOS M4 becomes the lowest voltage in the high breakdown voltage switch S7 as described hereinabove. Consequently, the nMOS M4 is turned off.

Further, although the current source M6 is controlled to an on state, since the current source M5 and the nMOS M4 are off, the current source M6 continues to supply current until the lowest potential with which the potential at the connection point N2 of the current sources M5 and M6 can be dropped is reached. As a result, also the current source M6 is placed into a state similar to an off state. In other words, all of the nMOS M4, pMOS M3 and current sources M5 and M6 are placed into an off state. At this time, since all transistor configurations are in the off state, the high breakdown voltage switch S7 in the second non-conducting state illustrated in FIG. 24 does not supply steady current and hence is in a low power consuming state. It is to be noted that, although the pMOS M3 is temporarily placed into an on state in the transient state in which the potential at the connection point N2 is equal to the potential at the fixed voltage source Vss, if the pMOS M3 is placed into an on state, then the fixed voltage source Vss and the connection point N2 are connected to each other. Therefore, there is no special problem.

However, since the potential at the connection point N7 is controlled to the lowest potential in the high breakdown voltage switch S7, in order to change the high breakdown voltage switch S4 from the second non-conducting state to the conducting state, it is necessary to wait until the potential at the connection point N7 rises to the potential inputted from the input terminal Vin. For example, if the potential inputted from the input terminal Vin subsequently is the potential at the terminal Vin18 which outputs the highest potential among the battery cells shown in FIG. 13, then time is required until the potential at the connection point N7 rises from a voltage near to the lowest potential in the high breakdown voltage switch S7 to the highest potential. This is not suitable for high speed switching.

Accordingly, in the case where a high speed switching operation is required, switching between the conducting state illustrated in FIG. 22 and the first non-conducting state illustrated in FIG. 23 is used to implement high speed switching. However, in the case where a high speed switching operation is not required, switching between the conducting state illustrated in FIG. 22 and the second non-conducting state illustrated in FIG. 24 is used to implement non-high speed switching. By selectively using such high speed switching and non-high speed switch as described above, both of low power consumption and high speed switching can be achieved.

B-5. Eighth Configuration Form of the High Breakdown Voltage Switch

Figure 25:
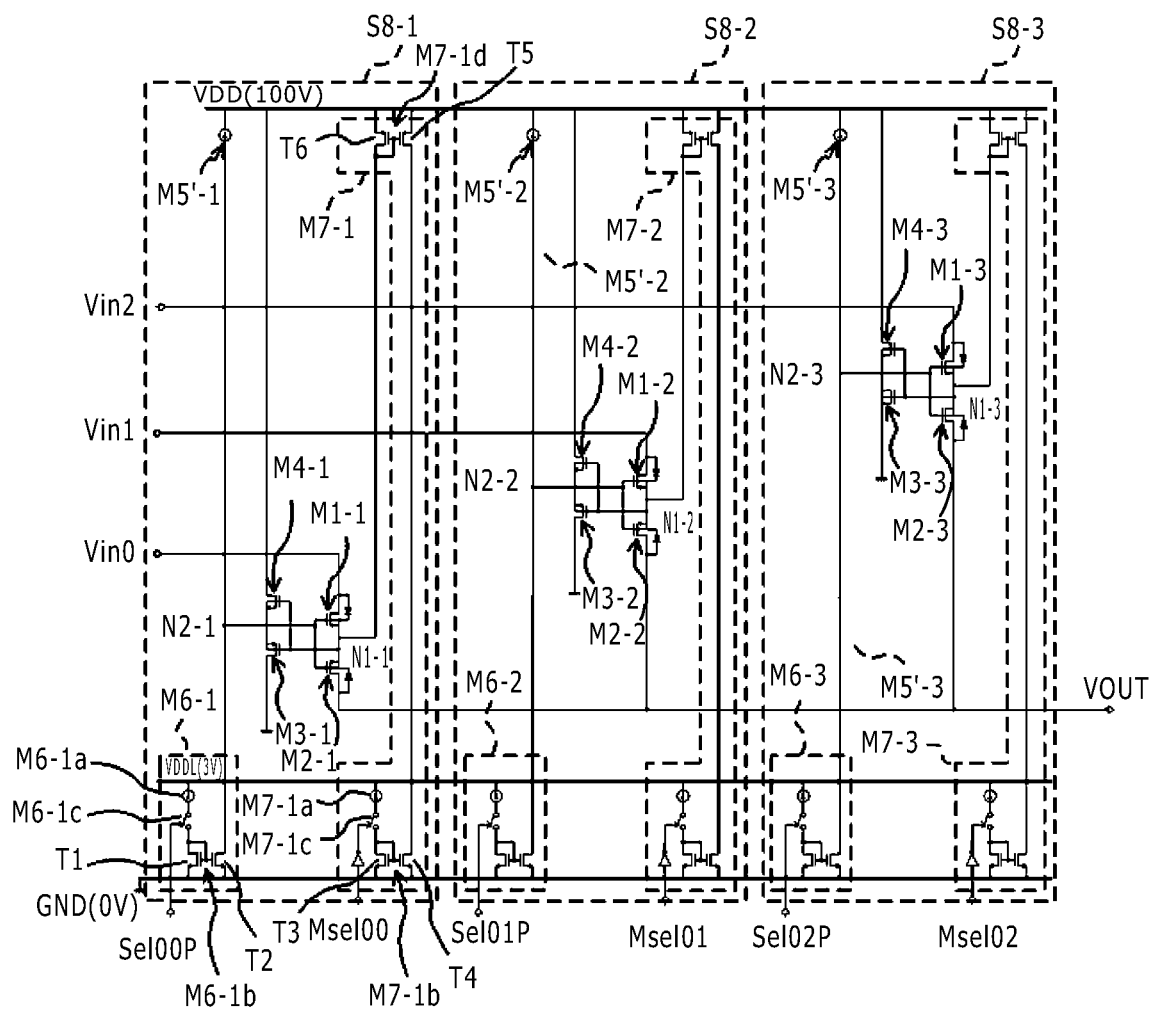
FIG. 25 is a circuit diagram showing a basic configuration of a high breakdown voltage switch according to an eighth configuration form.

FIG. 25 shows a basic configuration of a high breakdown voltage switch S8 according to an eighth configuration form. As seen in FIG. 25, the high breakdown voltage switch S8 of the present configuration form provides a particular example wherein the high breakdown voltage switch S6 of the sixth configuration form described hereinabove is incorporated using a transistor circuit. In the example shown in FIG. 25, changeover of the current source M6 and the switch circuit M7 between on and off is implemented using a current mirror circuit.

It is to be noted that, while FIG. 25 shows only three positive phase switches which input voltage signals of positive phase to the positive phase input terminal 212P, in the case where differential signals are used to detect a battery voltage as seen in FIG. 13, it is a matter of course that also negative phase switches which input voltage signals of negative phase to the negative phase input terminal 212N are provided. Further, the number of such switches is selected suitably in response to the number of rechargeable battery cells. Further, while FIG. 25 shows an example wherein the high breakdown voltage switch S6 according to the sixth configuration form is incorporated, naturally it is possible to incorporate the high breakdown voltage switches according to the other configuration forms by a similar method.

A current source circuit M6-1 includes a current source M6-1a, a current mirror circuit M6-1b configured from two nMOSs T1 and T2 connected at the gates thereof to each other, and a switch M6-1c. The nMOS T1 is connected at the drain thereof to a fixed voltage source Vdd1 of 3 V through the switch M6-1c and the current source M6-1a and at the source thereof to the ground of 0 V. Meanwhile, the nMOS T2 is connected at the drain thereof to a connection point N2-1 and at the source thereof to the ground of 0 V. The switch M6-1c can be changed over between on and off by a positive phase selection signal Sel00P.

Consequently, if a voltage signal of the high level is inputted as the positive phase selection signal Sel00P to the switch M6-1c, then current of the current source M6-1a flows from the source to the drain of the nMOS T1 and also to the nMOS T2. At this time, the nMOS M4-1 and the current source circuit M6-1 can operate as a source follower. In other words, it is possible to cause the nMOS M4-1 and the current source circuit M6-1 to operate as a source follower circuit using the positive phase selection signal Sel00P.

The switch M7-1 includes a current source M7-1a, a current mirror circuit M7-1b configured from two nMOSs T3 and T4 connected at the gates thereof to each other, a switch M7-1c, and a current mirror circuit M7-1d configured from pMOSs T5 and T6 connected at the gate thereof each other.

The nMOS T3 is connected at the drain thereof to the fixed voltage source Vdd1 of 3 V through the switch M7-1c and the current source M7-1a and at the source thereof to the ground of 0 V. Meanwhile, the nMOS T4 is connected at the drain thereof to the drain of the pMOS T5 and at the source thereof to the ground of 0 V. The pMOS T5 is connected at the source thereof to the fixed voltage source Vdd of 100 V. The pMOS T6 is connected at the source thereof to the fixed voltage source Vdd of 100 V and at the drain thereof to a connection point N1-1.

Consequently, if a voltage signal of the high level is inputted as the main selection signal Msel00 to the switch M7-1c, then current of the current source M7-1a flows from the source to the drain of the nMOS T3 and current flows from the drain to the source of the nMOS T4. Current flows also from the source to the drain of the pMOS T5 and current flows from the source to the drain of the pMOS T6. It is to be noted that 100 V which is a potential of the fixed voltage source Vdd can be supplied to the connection point N1-1 at a suitable timing with the main selection signal Msel00.

It is to be noted that the other high breakdown voltage switches S8-2 and S8-3 are configured similarly to the current source circuit M6-1 and the switch circuit M7-1 of the high breakdown voltage switch S8-1 and include a current source circuit M6-2 or a switch circuit M7-2, and a current source circuit M6-3 or a switch circuit M7-3. Thus, on/off of current to be supplied to the connection points N2-2 and N2-3 and on/off of the fixed voltage of 100 V to be supplied to the connection points N1-2 and N1-3 can be controlled at suitable timings using positive phase selection signal Sel01P or Sel02P and a main selection signal Msel01 or Msel02.

B-6. Ninth Configuration Form of the High Breakdown Voltage Switch

Figure 26:
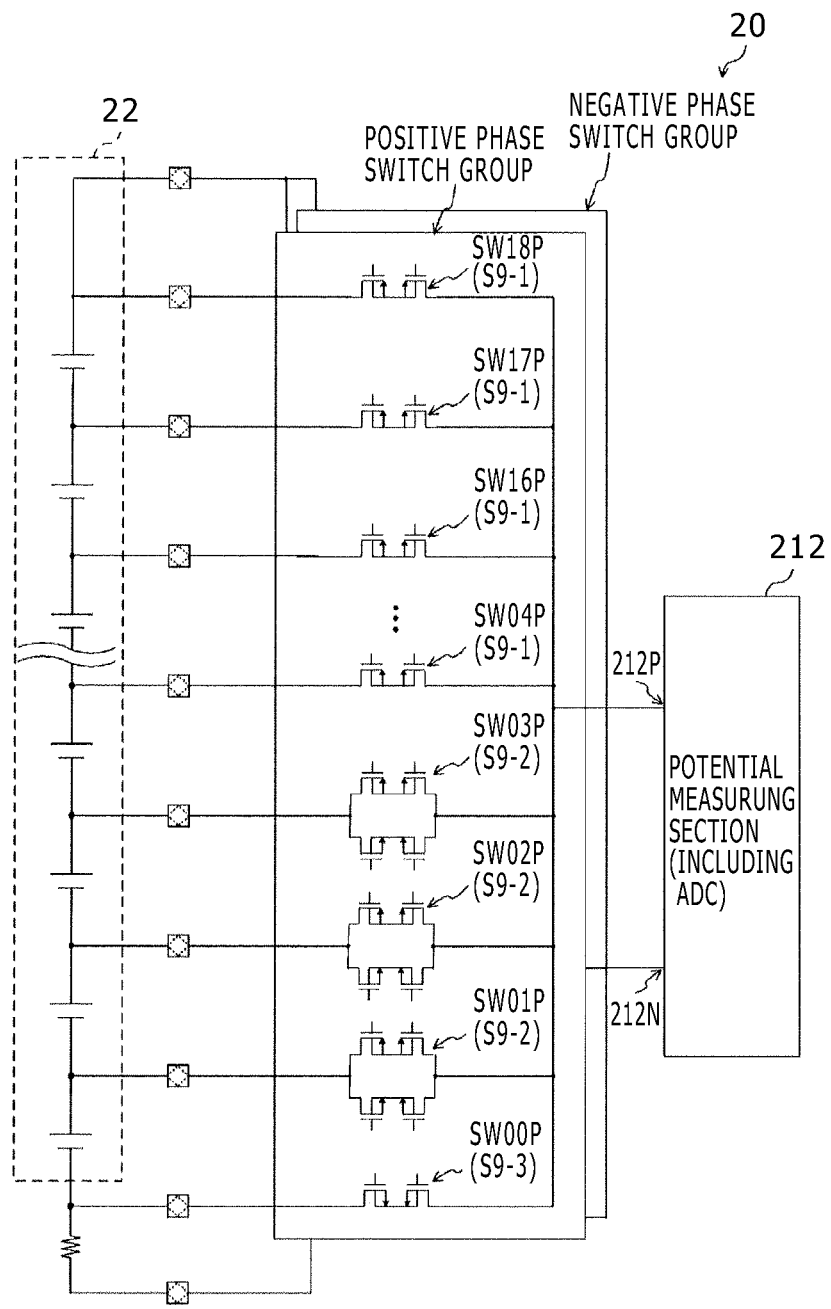
FIG. 26 is a circuit diagram showing a basic configuration of a high breakdown voltage switch according to a ninth configuration form.

FIG. 26 shows a basic configuration of a high breakdown voltage switch according to a ninth configuration form. As seen in FIG. 26, the high breakdown voltage switch is a particular example wherein the high breakdown voltage switch S4 of the fourth configuration form and the high breakdown voltage switch S7 of the seventh configuration form described hereinabove are incorporated in combination.

Referring to FIG. 26, the high breakdown voltage switch of the present ninth configuration form is configured generally for suitable selective use of high breakdown voltage switches S9-1, S9-2 and S9-3. The high breakdown voltage switch S9-1 is configured only from the high breakdown voltage switch S4 of the fourth configuration form described hereinabove. The high breakdown voltage switch S9-2 is configured from a combination of the high breakdown voltage switch S4 of the fourth configuration form and the high breakdown voltage switch S7 of the seventh configuration form described hereinabove. The high breakdown voltage switch S9-3 is configured only from the high breakdown voltage switch S7 of the seventh configuration form described hereinabove.

In the high breakdown voltage switch S9-2, the high breakdown voltage switch S4 and the high breakdown voltage switch S7 are disposed in parallel and are connected at the input terminals thereof to each other so as to be used as an input terminal to the high breakdown voltage switch S9-2. Meanwhile, the high breakdown voltage switch S4 and the high breakdown voltage switch S7 are connected at the output terminals thereof to each other so as to be used as an output terminal of the high breakdown voltage switch S9-2. In other words, the high breakdown voltage switch S9-2 has a combination structure of the second transistor circuit TC24 and the second transistor circuit TC27 described hereinabove.

It is to be noted that the second transistor circuit TC24 configures a PMOS switch; the second transistor circuit TC27 configures an NMOS switch; the nMOS M4, pMOS M3, current sources M5 and M6 and switch circuit M7 connected to the second transistor circuit TC24 configure a first switch controlling circuit; and the nMOS M4, pMOS M3, current sources M5 and M6 and switch circuit M7 connected to the second transistor circuit TC27 configure a second switch controlling circuit.

Here, the high breakdown voltage switch S4 has a characteristic that, when the input voltage drops to a level proximate to 0 V, it is difficult to implement a high speed on/off operation while the high breakdown voltage switch S7 has another characteristic that, as the input voltage is high, it becomes difficult to implement a high speed on/off operation. Therefore, for the switches SW04P to SW18P which take charge of an on/off operation of the voltage of a rechargeable battery cell on the high voltage side, the high breakdown voltage switch S9-1 configured from the high breakdown voltage switch S4 is used. Further, for the positive phase switch SW00P which takes charge of an on/off operation of the voltage of a rechargeable battery cell on the low voltage side proximate to 0 V, the high breakdown voltage switch S9-3 configured from the high breakdown voltage switch S7 is used.

Further, for the switches SW01P to SW03P which take charge of an on/off operation of the voltage of an intermediate rechargeable battery cell, the high breakdown voltage switch S9-2 implemented by combination of the high breakdown voltage switch S4 and the high breakdown voltage switch S7 is used. If the high breakdown voltage switch S9-2 is adopted in this manner, then it is possible to use an appropriate one of a first changeover mode carried out using the high breakdown voltage switch S4 and a second changeover mode carried out using the high breakdown voltage switch S7 to carry out switching in accordance with an application. Therefore, a high breakdown voltage which can achieve high speed switching without depending upon the input voltage can be provided.

C. Summary

While various configuration forms of a high breakdown voltage switch, particular embodiments of a switch for operating the high breakdown voltage switch and so forth are described above, the present technology can be configured also in the following manner.

(1) A switch for turning on/off the connection between a first terminal and a second terminal, including: a first transistor circuit configured from two transistors connected in series between the first terminal and the second terminal; and a second transistor circuit having a gate terminal connected to source terminals of the two transistors and a source terminal connected to gate terminals of the two transistors, the connection between the first terminal and the second terminal being changed over between on and off states by changing over a potential to the source terminal of the second transistor circuit between high and low levels.

(2) The switch according to (1) above, wherein the two transistors are configured from a first P-type MOS transistor and a second P-type MOS transistor having source terminals connected to each other, and the second transistor circuit includes a third P-type MOS transistor which has a gate terminal connected to the source terminals of the first and second P-type MOS transistors and a source terminal connected to gate terminals of the first and second P-type MOS transistors.

(3) The switch according to (2) above, wherein turning on of the third P-type MOS transistor turns off the first P-type MOS transistor and the second P-type MOS transistor to cut the connection between the first terminal and the second terminal.

(4) The switch according to any one of (1) to (3) above, wherein the two transistors are configured from a first P-type MOS transistor and a second P-type MOS transistor having source terminals connected to each other, and the second transistor circuit includes a fourth N-type MOS transistor having a gate terminal connected to the source terminals of the first and second P-type MOS transistors and a source terminal connected to gate terminals of the first and second P-type MOS transistors.

(5) The switch according to (4) above, wherein turning on of the fourth N-type MOS transistor turns on the first P-type MOS transistor and the second P-type MOS transistor to turn on the connection between the first terminal and the second terminal.

(6) The switch according to (1) above, wherein the two transistors are configured from a fifth N-type MOS transistor and a sixth N-type MOS transistor having source terminals connected to each other, and the second transistor circuit includes a seventh P-type MOS transistor having a gate terminal connected to the source terminals of the fifth and sixth N-type MOS transistors and a source terminal connected to gate terminals of the fifth and sixth N-type MOS transistors.

(7) The switch according to (6) above, wherein turning on of the seventh P-type MOS transistor turns on the fifth N-type MOS transistor and the sixth N-type MOS transistor to turn on the connection between the first terminal and the second terminal.

(8) The switch according to any one of (1), (6) and (7) above, wherein the two transistors are configured from a fifth N-type MOS transistor and a sixth N-type MOS transistor having source terminals connected to each other, and the second transistor circuit includes an eighth N-type MOS transistor having a gate terminal connected to the source terminals of the fifth and sixth N-type MOS transistors and a source terminal connected to gate terminals of the fifth and sixth N-type MOS transistors.

(9) The switch according to (8) above, wherein turning on of the eighth N-type MOS transistor turns off the fifth N-type MOS transistor and the sixth N-type MOS transistor to cut the connection between the first terminal and the second terminal.

(10) The switch according to any one of (1) to (9) above, further including a switch circuit configured to change over the connection between a connection point between the two transistors and a predetermined fixed voltage source.

(11) The switch according to (1) above, wherein the two transistors are configured from a ninth N-type MOS transistor and a tenth N-type MOS transistor, and the second transistor includes an eleventh N-type MOS transistor having a gate terminal connected to a source terminal of the ninth N-type MOS transistor and a source terminal connected to a gate terminal of the ninth N-type MOS transistor, and a twelfth N-type MOS transistor having a gate terminal connected to a source terminal of the tenth N-type MOS transistor and a source terminal connected to a gate terminal of the tenth N-type MOS transistor.

(12) The switch according to any one of (1), (2) and (11) above, further including: a current mirror circuit configured to change over a potential at the source terminal of the second transistor circuit between high and low levels depending upon whether or not current is to be extracted from the source terminal; and a switch circuit configured to change over whether or not current is to be supplied to the current mirror circuit in accordance with a control signal.

(13) The switch according to (12) above, wherein the current mirror circuit is configured from a plurality of current mirror circuits connected to each other, and the switch circuit includes a transistor connected to one of gate terminals of the current mirror circuits and changes over whether or not current is to be supplied to the transistor to change over whether or not current is to be supplied to the current mirror circuits.

(14) A switch for turning on/off the connection between a first terminal and a second terminal, including: a P-type MOS switch formed from two P-type MOS transistors connected in series between the first terminal and the second terminal; a first switch controlling circuit including a transistor having a gate terminal connected to source terminals of the two P-type MOS transistors and a source terminal connected to gate terminals of the two P-type MOS transistors; an N-type MOS switch formed from two N-type MOS transistors connected in series between the first terminal and the second terminal; and a second switch controlling circuit including a transistor having a gate terminal connected to source terminals of the two N-type MOS transistors and a source terminal connected to gate terminals of the two N-type MOS transistors.

(15) The switch according to (14) above, wherein a first changeover mode of changing over the connection between the first terminal and the second terminal between on and off states is implemented by changing over a potential of the source terminal of the transistor provided in the first switch controlling circuit between high and low levels, and a second changeover mode of changing over the connection between the first terminal and the second terminal between on and off states is implemented by changing over a potential of the source terminal of the transistor provided in the second switch controlling circuit between high and low levels.

(16) A switch for turning on/off the connection between a first terminal and a second terminal, including: a plurality of switch circuits each having a first transistor circuit configured from two transistors connected in series between the first terminal and the second terminal, a second transistor circuit having a gate terminal connected to source terminals of the two transistors and a source terminal connected to gate terminals of the two transistors, a first current mirror circuit connected to the source terminal of the second transistor circuit, a first transistor having a drain terminal connected to the first current mirror circuit, a first switch having a first end connected to a gate terminal of the first transistor, and a second switch having a first end connected to the gate terminal of the first transistor and a second end grounded; and a second transistor having a gate terminal connected to a second end of the first switches of the switch circuits, the first switch being changed over between on and off states to change over whether or not the first transistor and the second transistor are to operate as a second current mirror circuit whereas the second switch is changed over between on and off states to change over whether or not current is to be supplied to the first and second current mirror circuits thereby to changeover the potential at the source terminal of the second transistor circuit between high and low levels.

(17) A charge monitoring apparatus for monitoring a charged state of a plurality of rechargeable battery cells, including: a potential measuring section configured to measure a potential of the rechargeable battery cells; and a switch configured to select one of the rechargeable battery cells which is to be measured by the potential measuring section, the switch turning on/off the connection between the selected one of the rechargeable battery cells and the potential measuring section, the switch including a first transistor circuit configured from two transistors connected in series between the rechargeable battery cells and the potential measuring section, and a second transistor circuit having a gate terminal connected to source terminals of the two transistors and a source terminal connected to gate terminals of the two transistors, the connection between the rechargeable battery cells and the potential measuring section being changed over between on and off states by changing over a potential to the source terminal of the second transistor circuit between high and low levels.

(18) A rechargeable battery module including: a plurality of rechargeable battery cells; and a charge monitoring apparatus including a potential measuring section for measuring a potential of the rechargeable battery cells and a switch for selecting one of the rechargeable battery cells which is to be measured by the potential measuring section, the switch turning on/off the connection between the selected one of the rechargeable battery cells and the potential measuring section, the switch including a first transistor circuit configured from two transistors connected in series between the rechargeable battery cells and the potential measuring section, and a second transistor circuit having a gate terminal connected to source terminals of the two transistors and a source terminal connected to gate terminals of the two transistors, the connection between the rechargeable battery cells and the potential measuring section being changed over between on and off states by changing over a potential to the source terminal of the second transistor circuit between high and low levels.

It is to be noted that the switches described above are analog switches and, even if they are placed into an off state, they cannot fully interrupt current but sometimes pass current therethrough although it may be very small. Also, even if the switches are placed into an on state, sometimes current which flows through the switches is reduced although it may be very small. The on state of a switch described above signifies a state in which current flows through the switch in comparison with current in the off state of the switch, and the off state is a state in which current does not flow in comparison with that in the on state.

The embodiments and the configuration forms disclosed herein are mere examples of the present technology, and the present technology shall not be restricted to the embodiments and the configuration forms described above. Therefore, the embodiments and the configuration forms described above can naturally be modified or altered in various manners depending upon design specifications and so forth without departing from the technical scope of the present disclosure. Further, the present technology is not restricted to the embodiments and the configuration examples described above but includes such forms that include replacement of or modification to the components or configurations disclosed in the embodiments and the configuration forms and such forms that include replacement of or modification to the components or configurations disclosed in the embodiments and the configuration forms with or with reference to the related art as well as like forms.

The present disclosure contains subject matter related to that disclosed in Japanese Priority Patent Application JP 2012-130116 filed in the Japan Patent Office on Jun. 7, 2012, the entire content of which is hereby incorporated by reference.

What is claimed is:

1. A switch for turning on/off the connection between a first terminal and a second terminal, comprising:
   a first transistor circuit configured from two transistors connected in series between the first terminal and the second terminal; and
   a second transistor circuit having a gate terminal connected to source terminals of the two transistors and a source terminal connected to gate terminals of the two transistors,
   the connection between the first terminal and the second terminal being changed over between on and off states by changing over a potential to the source terminal of said second transistor circuit between high and low levels.

2. The switch according to claim 1,
   wherein the two transistors are configured from a first P-type MOS transistor and a second P-type MOS transistor having source terminals connected to each other, and
   said second transistor circuit includes a third P-type MOS transistor which has a gate terminal connected to the source terminals of said first and second P-type MOS transistors and a source terminal connected to gate terminals of said first and second P-type MOS transistors.

3. The switch according to claim 2, wherein turning on of said third P-type MOS transistor turns off said first P-type MOS transistor and said second P-type MOS transistor to cut the connection between the first terminal and the second terminal.

4. The switch according to claim 1,
   wherein the two transistors are configured from a first P-type MOS transistor and a second P-type MOS transistor having source terminals connected to each other, and
   said second transistor circuit includes a fourth N-type MOS transistor having a gate terminal connected to the source terminals of said first and second P-type MOS transistors and a source terminal connected to gate terminals of said first and second P-type MOS transistors.

5. The switch according to claim 4, wherein turning on of said fourth N-type MOS transistor turns on said first P-type MOS transistor and said second P-type MOS transistor to turn on the connection between the first terminal and the second terminal.

6. The switch according to claim 1,
   wherein the two transistors are configured from a fifth N-type MOS transistor and a sixth N-type MOS transistor having source terminals connected to each other, and
   said second transistor circuit includes a seventh P-type MOS transistor having a gate terminal connected to the source terminals of said fifth and sixth N-type MOS transistors and a source terminal connected to gate terminals of said fifth and sixth N-type MOS transistors.

7. The switch according to claim 6, wherein turning on of said seventh P-type MOS transistor turns on said fifth N-type MOS transistor and said sixth N-type MOS transistor to turn on the connection between the first terminal and the second terminal.

8. The switch according to claim 1,
wherein the two transistors are configured from a fifth N-type MOS transistor and a sixth N-type MOS transistor having source terminals connected to each other, and
said second transistor circuit includes an eighth N-type MOS transistor having a gate terminal connected to the source terminals of said fifth and sixth N-type MOS transistors and a source terminal connected to gate terminals of said fifth and sixth N-type MOS transistors.

9. The switch according to claim 8, wherein turning on of said eighth N-type MOS transistor turns off said fifth N-type MOS transistor and said sixth N-type MOS transistor to cut the connection between the first terminal and the second terminal.

10. The switch according to claim 1, further comprising a switch circuit configured to change over the connection between a connection point between the two transistors and a predetermined fixed voltage source.

11. The switch according to claim 1,
wherein the two transistors are configured from a ninth N-type MOS transistor and a tenth N-type MOS transistor, and
said second transistor includes an eleventh N-type MOS transistor having a gate terminal connected to a source terminal of said ninth N-type MOS transistor and a source terminal connected to a gate terminal of said ninth N-type MOS transistor, and a twelfth N-type MOS transistor having a gate terminal connected to a source terminal of said tenth N-type MOS transistor and a source terminal connected to a gate terminal of said tenth N-type MOS transistor.

12. The switch according to claim 1, further comprising:
a current mirror circuit configured to change over a potential at the source terminal of said second transistor circuit between high and low levels depending upon whether or not current is to be extracted from the source terminal; and
a switch circuit configured to change over whether or not current is to be supplied to said current mirror circuit in accordance with a control signal.

13. The switch according to claim 12,
wherein said current mirror circuit is configured from a plurality of current mirror circuits connected to each other, and
said switch circuit includes a transistor connected to one of gate terminals of the current mirror circuits and changes over whether or not current is to be supplied to the transistor to change over whether or not current is to be supplied to said current mirror circuits.

14. A switch for turning on/off the connection between a first terminal and a second terminal, comprising:
a P-type MOS switch formed from two P-type MOS transistors connected in series between the first terminal and the second terminal;
a first switch controlling circuit including a transistor having a gate terminal connected to source terminals of the two P-type MOS transistors and a source terminal connected to gate terminals of the two P-type MOS transistors;
an N-type MOS switch formed from two N-type MOS transistors connected in series between the first terminal and the second terminal; and
a second switch controlling circuit including a transistor having a gate terminal connected to source terminals of the two N-type MOS transistors and a source terminal connected to gate terminals of the two N-type MOS transistors.

15. The switch according to claim 14,
wherein a first changeover mode of changing over the connection between the first terminal and the second terminal between on and off states is implemented by changing over a potential of the source terminal of the transistor provided in said first switch controlling circuit between high and low levels, and
a second changeover mode of changing over the connection between the first terminal and the second terminal between on and off states is implemented by changing over a potential of the source terminal of the transistor provided in said second switch controlling circuit between high and low levels.

16. A switch for turning on/off the connection between a first terminal and a second terminal, comprising:
a plurality of switch circuits each having
a first transistor circuit configured from two transistors connected in series between the first terminal and the second terminal,
a second transistor circuit having a gate terminal connected to source terminals of the two transistors and a source terminal connected to gate terminals of the two transistors,
a first current mirror circuit connected to the source terminal of said second transistor circuit,
a first transistor having a drain terminal connected to said first current mirror circuit,
a first switch having a first end connected to a gate terminal of said first transistor, and
a second switch having a first end connected to the gate terminal of said first transistor and a second end grounded; and
a second transistor having a gate terminal connected to a second end of the first switches of said switch circuits,
said first switch being changed over between on and off states to change over whether or not said first transistor and said second transistor are to operate as a second current mirror circuit whereas said second switch is changed over between on and off states to change over whether or not current is to be supplied to said first and second current mirror circuits thereby to changeover the potential at the source terminal of said second transistor circuit between high and low levels.

17. A charge monitoring apparatus for monitoring a charged state of a plurality of rechargeable battery cells, comprising:
a potential measuring section configured to measure a potential of the rechargeable battery cells; and
a switch configured to select one of the rechargeable battery cells which is to be measured by said potential measuring section,
said switch turning on/off the connection between the selected one of said rechargeable battery cells and said potential measuring section,
said switch including
a first transistor circuit configured from two transistors connected in series between said rechargeable battery cells and said potential measuring section, and
a second transistor circuit having a gate terminal connected to source terminals of the two transistors and a source terminal connected to gate terminals of the two transistors,
the connection between said rechargeable battery cells and said potential measuring section being changed over between on and off states by changing over a potential to the source terminal of said second transistor circuit between high and low levels.

18. A rechargeable battery module comprising:

a plurality of rechargeable battery cells; and a charge monitoring apparatus including a potential measuring section for measuring a potential of said rechargeable battery cells and a switch for selecting one of said rechargeable battery cells which is to be measured by said potential measuring section, said switch turning on/off the connection between the selected one of said rechargeable battery cells and said potential measuring section, said switch including

- a first transistor circuit configured from two transistors connected in series between said rechargeable battery cells and said potential measuring section, and
- a second transistor circuit having a gate terminal connected to source terminals of the two transistors and a source terminal connected to gate terminals of the two transistors, the connection between said rechargeable battery cells and said potential measuring section being changed over between on and off states by changing over a potential to the source terminal of said second transistor circuit between high and low levels.

\* \* \* \* \*